(12) United States Patent
Maeda

(10) Patent No.: US 10,879,091 B2
(45) Date of Patent: Dec. 29, 2020

(54) SUBSTRATE TREATING APPARATUS

(71) Applicant: SCREEN Holdings Co., Ltd., Kyoto (JP)

(72) Inventor: Masafumi Maeda, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/203,885

(22) Filed: Nov. 29, 2018

(65) Prior Publication Data

US 2019/0096719 A1    Mar. 28, 2019

Related U.S. Application Data

(63) Continuation of application No. 15/346,063, filed on Nov. 8, 2016, now Pat. No. 10,170,349.

(30) Foreign Application Priority Data

Nov. 13, 2015   (JP) ................................ 2015-223003

(51) Int. Cl.
     *H01L 21/67*      (2006.01)
     *G03F 7/16*      (2006.01)
     (Continued)

(52) U.S. Cl.
     CPC ...... *H01L 21/67178* (2013.01); *B05C 5/0208* (2013.01); *B05D 1/005* (2013.01);
     (Continued)

(58) Field of Classification Search
     CPC ............... H01L 21/67178; H01L 21/00; H01L 21/6715; H01L 21/67173; H01L 21/6719;
     (Continued)

(56) References Cited

U.S. PATENT DOCUMENTS 5,937,223 A    8/1999   Akimoto et al. .............. 396/604
6,123,120 A    9/2000   Totsumoto ....................... 141/59
(Continued)

FOREIGN PATENT DOCUMENTS

JP      06-084876 A      3/1994
JP      2003-100620 A      4/2003
(Continued)

OTHER PUBLICATIONS

Office Action and Search Report dated May 18, 2017 for corresponding Taiwan Patent Application No. 105136806.
(Continued)

*Primary Examiner* — Laura Edwards
(74) *Attorney, Agent, or Firm* — Ostrolenk Faber LLP

(57) ABSTRACT

A substrate treating apparatus includes a plurality of solution treating units for performing solution treatment of substrates, and a plurality of individual gas supply devices provided to correspond individually to the solution treating units, each for supplying gas at a variable rate only to one of the solution treating units. The solution treating units perform the solution treatment by supplying treating solutions to the substrates. The individual gas supply devices supply gas only to the solution treating units corresponding thereto. The individual gas supply devices supply the gas at adjustable rates to the solution treating units. The rate of gas supply to the solution treating units can therefore be varied for each solution treating unit. A pair of the solution treating units are both arranged and carry out the solution treatment in a same chamber.

18 Claims, 15 Drawing Sheets

(51) Int. Cl.
*G03F 7/30* (2006.01)
*B05C 5/02* (2006.01)
*H01L 21/00* (2006.01)
*H01L 21/677* (2006.01)
*B05C 15/00* (2006.01)
*B05D 1/00* (2006.01)

(52) U.S. Cl.
CPC ............ *G03F 7/162* (2013.01); *G03F 7/3092* (2013.01); *H01L 21/00* (2013.01); *H01L 21/6715* (2013.01); *H01L 21/67017* (2013.01); *H01L 21/6719* (2013.01); *H01L 21/67173* (2013.01); *H01L 21/67253* (2013.01); *H01L 21/67742* (2013.01); *B05C 15/00* (2013.01)

(58) Field of Classification Search
CPC ......... H01L 21/67253; H01L 21/67742; H01L 21/67017; H01L 21/02052; H01L 21/02307; H01L 21/6704; G03F 7/162; G03F 7/3092; B05C 5/0208; B05C 15/00; B05B 15/002; B05D 1/005
USPC ............ 396/611, 564; 118/52, 56, 319, 320; 134/902
See application file for complete search history.

(56) References Cited

U.S. PATENT DOCUMENTS

| | | | |
|---|---|---|---|
| 7,401,988 B2 | 7/2008 | Katano | 118/58 |
| 10,170,349 B2* | 1/2019 | Maeda | G03F 7/162 |
| 2003/0217695 A1 | 11/2003 | Fukutomi et al. | 118/666 |
| 2004/0261817 A1* | 12/2004 | Araki | H01L 21/67051 134/2 |
| 2006/0024446 A1 | 2/2006 | Sugimoto et al. | 427/377 |
| 2006/0189103 A1 | 8/2006 | Matsuoka et al. | 438/478 |
| 2009/0000543 A1 | 1/2009 | Fukutomi et al. | 118/58 |
| 2009/0165712 A1 | 7/2009 | Ogura et al. | 118/695 |
| 2009/0191718 A1 | 7/2009 | Nakashima | 438/758 |
| 2011/0256733 A1 | 10/2011 | Hirose et al. | 438/770 |
| 2012/0160279 A1 | 6/2012 | Konishi et al. | 134/99.1 |
| 2012/0249990 A1 | 10/2012 | Nishimura et al. | 355/72 |
| 2015/0200087 A1 | 7/2015 | Kobayashi | 134/30 |

FOREIGN PATENT DOCUMENTS

| | | |
|---|---|---|
| JP | 2003-347186 A | 12/2003 |
| JP | 2006-024638 A | 1/2006 |
| JP | 2006-229062 A | 8/2006 |
| JP | 2009-010291 A | 1/2009 |
| JP | 2010-087115 A | 4/2010 |
| JP | 2010-087116 | 4/2010 |
| JP | 4471865 B2 | 6/2010 |
| JP | 2012-156488 A | 8/2012 |
| JP | 2013-089689 A | 5/2013 |
| KR | 10-2009-0036695 | 4/2009 |
| KR | 10-2012-0112012 | 10/2012 |
| KR | 10-2014-0053057 | 5/2014 |
| TW | 201203363 A1 | 1/2012 |
| TW | 201250914 A1 | 12/2012 |
| TW | 201532691 A | 9/2015 |
| TW | I508152 B | 11/2015 |

OTHER PUBLICATIONS

Office Action dated Nov. 6, 2018 for corresponding Japanese Patent Application No. 2015-223003.

Office Action dated Mar. 22, 2019 for Korean Patent Application No. 10-2019-0000781.

Office Action dated Mar. 29, 2019 for Taiwan Patent Application No. 107122853.

* cited by examiner

SUBSTRATE TREATING APPARATUS

CROSS-REFERENCE TO RELATED APPLICATIONS

This application is a continuation of U.S. patent application Ser. No. 15/346,063, filed Nov. 8, 2016, now U.S. Pat. No. 10,170,349, which claims the benefit of Japanese Patent Application No. 2015-223003, filed Nov. 13, 2015, the contents of which are incorporated herein by reference.

BACKGROUND OF THE INVENTION

(1) Field of the Invention

This invention relates to a substrate treating apparatus for treating semiconductor wafers, glass substrates for photomasks, glass substrates for liquid crystal displays, substrates for optical disks and so on (hereinafter called simply substrates).

(2) Description of the Related Art

Conventionally, this type of apparatus includes an apparatus having a treating section, a gas supply device and a gas exhaust device. The treating section has a first treating unit and a second treating unit arranged horizontally. The gas supply device supplies gas to the first treating unit and second treating unit together. The gas exhaust device exhausts gas from the first treating unit and second treating unit together.

The gas supply device has a supply damper and a supply unit. The supply damper uniformly adjusts a rate of gas supply to the first treating unit and second treating unit. The supply unit blows out the gas to both the first treating unit and second treating unit.

The gas exhaust device has an exhaust unit and an exhaust damper. The exhaust unit exhausts gas from both the first treating unit and second treating unit. The exhaust damper uniformly adjusts a rate of gas exhaust from the first treating unit and second treating unit (as disclosed in Japanese Unexamined Patent Publication No. 2010-87116 for example).

SUMMARY OF THE INVENTION

The conventional apparatus with such a construction has the following drawbacks.

The rate of gas supply to the first treating unit and the rate of gas supply to the second treating unit cannot be changed individually. The rate of gas supply to the first treating unit and the rate of gas supply to the second treating unit are always the same. However, the timing of substrate treatment carried out by the first treating unit and the timing of substrate treatment carried out by the second treating unit are not necessarily the same. For example, the first treating unit may treat substrates in a first period, with the second treating unit treating substrates in a second period staggered from the first period. When the first period and the second period are staggered, it is difficult to supply an appropriate quantity of gas to both the first treating unit and second treating unit in a timely way. It is because the rate of gas supply to the first treating unit and the rate of gas supply to the second treating unit cannot be changed individually. It is therefore difficult to improve the treatment quality of each of the first treating unit and the second treating unit.

Similarly, the rate of gas exhaust from the first treating unit and the rate of gas exhaust from the second treating unit cannot be changed individually. It is therefore difficult to improve the treatment quality of each of the first treating unit and the second treating unit.

This invention has been made having regard to the state of the art noted above, and its object is to provide a substrate treating apparatus which can improve the treatment quality of each of a plurality of treating units.

To fulfill the above object, this invention provides the following construction.

A substrate treating apparatus, according to this invention, comprises a plurality of solution treating units for performing solution treatment of substrates; and a plurality of individual gas supply devices provided to correspond individually to the solution treating units, each for supplying gas at a variable rate only to one of the solution treating units.

The substrate treating apparatus according to this invention has a plurality of solution treating units and a plurality of individual gas supply devices. One individual gas supply device is provided for each solution treating unit. Each gas supply device is related to one of the solution treating units. The solution treating units perform solution treatment of substrates. The solution treatment is a treatment carried out by supplying the substrates with a treating solution. The individual gas supply devices supply gas only to the solution treating units corresponding to the individual gas supply devices. Further, the gas supply devices have an adjustable rate of gas supply to the solution treating units corresponding to the individual gas supply devices. Therefore, the rate of gas supply to the solution treating units is changeable for each solution treating unit. Consequently, an appropriate quantity of gas can be supplied in appropriate timing to each solution treating unit. Therefore, treatment quality in each solution treating unit can be improved conveniently.

In the above invention, it is preferred that each of the individual gas supply devices includes a supply adjuster for adjusting the rate of gas supply to one of the solution treating units. The individual gas supply devices with the supply adjusters can conveniently adjust the rate of gas supply to the solution treating units.

In the above invention, it is preferred that the substrate treating apparatus further comprises distributing pipes provided to correspond individually to solution treating unit groups each formed of a plurality of the solution treating units arranged in a column substantially in an up-down direction, for distributing the gas only to a plurality of the individual gas supply devices corresponding to each solution treating unit group. A plurality of solution treating units arranged in a column substantially in the up-down direction constitute one solution treating unit group. The distributing pipes are provided individually for the solution treating unit groups. Each distributing pipe is related to one of the solution treating unit groups. As a result, each distributing pipe is related to the plurality of solution treating units belonging to one solution treating unit group, and the plurality of individual gas supply devices that supply gas to these solution treating units. Each distributing pipe distributes gas only to the plurality of individual gas supply devices corresponding to the distributing pipe. For example, each distributing pipe is connected only to the plurality of individual gas supply devices corresponding to the distributing pipe. The plurality of individual gas supply devices corresponding to the same distributing pipe supply the gas, respectively, to the plurality of solution treating units arranged in a column substantially in the up-down direction. Therefore, the shape, size, direction and so on of the individual gas supply devices can easily be uniformed among the plurality of individual gas supply devices corresponding to the same distributing pipe. As a result, the rates of gas supply can be prevented conveniently from interfering with one another among the individual gas supply devices corresponding to the same distributing pipe. For example, the rate of gas supply from part of the individual gas supply devices can be prevented conveniently from causing variations in the rates of gas supply from the other individual gas supply devices. When the rate of gas supply from part of the individual gas supply devices is changed intentionally, for example, this change can be prevented conveniently from inadvertently varying the rate of gas supply from the other individual gas supply devices. Since the distributing pipe distributes the gas to a plurality of individual gas supply devices, the individual gas supply devices can be reduced in size.

In the above invention, it is preferred that the plurality of individual gas supply devices are separated from one another at least inside the substrate treating apparatus. In other words, the individual gas supply devices are not connected directly or indirectly to one another at least inside the substrate treating apparatus. According to such a construction of the individual gas supply devices, whether the individual gas supply devices have supply adjusters or not, the rate of gas supply to the solution treating units can conveniently be changed for each solution treating unit. For example, even where the individual gas supply devices do not have supply adjusters, the rate of gas supply in the individual gas supply devices can be adjusted for each individual gas supply device by using external equipment. Consequently, the rate of gas supply to the solution treating units can be changed for each solution treating unit. The external equipment here is gas supplying external equipment installed outside the substrate treating apparatus for supplying the gas.

In the above invention, it is preferred that each of the individual gas supply devices includes a supply port for connection to external equipment installed outside the substrate treating apparatus; and a supply pipe connected to the supply port for transmitting the gas. Since each individual gas supply device has an individual supply port, the individual gas supply device can be connected easily to the external equipment. Since each individual gas supply device has a supply pipe, the individual gas supply device can conveniently send the gas supplied by the external equipment to the solution treating unit. Here, the external equipment, more strictly, is gas supplying external equipment.

In the above invention, it is preferred that the substrate treating apparatus further comprises a plurality of blowout units individually connected to the individual gas supply devices, each for blowing out the gas only to one of the solution treating units. Each blowout unit is connected to only one of the individual gas supply devices. Each individual gas supply device supplies the gas to the one blowout unit connected thereto. Each blowout unit blows out the gas to only one of the solution treating units. Thus, each solution treating unit is supplied with the gas conveniently.

In the above invention, it is preferred that the individual gas supply devices include supply pipes connected to the blowout units; and a plurality of the supply pipes respectively connected to a plurality of blowout units adjoining each other substantially in a horizontal direction extend in mutually different directions from the blowout units. The supply pipe of each individual gas supply device is connected only to the blowout unit corresponding to that individual gas supply device. Consequently, the individual gas supply device is conveniently connectable to the blowout unit. Where a plurality of blowout units are arranged to adjoin each other substantially in a horizontal direction, a plurality of supply pipes connected to these blowout units extend in mutually different directions from the blowout units. Consequently, the plurality of individual gas supply devices can be prevented conveniently from approaching each other. Therefore, even where the plurality of blowout units adjoin each other substantially in the horizontal direction, interference of the rates of gas supply can be prevented conveniently between the plurality of individual gas supply devices.

The supply pipes and blowout units may be connected directly or may be connected indirectly.

In the above invention, it is preferred that the substrate treating apparatus further comprises a controller for controlling the rate of gas supply from the individual gas supply devices to the solution treating units; wherein the controller changes individually the rate of gas supply to each of the solution treating units. The controller controls the rate of gas supply in the individual gas supply devices for each individual gas supply device. Consequently, the rate of gas supply to the solution treating units is changed for each solution treating unit. This can conveniently improve the quality of solution treatment of the substrates performed by each solution treating unit.

In the above invention, it is preferred that the controller changes the rate of gas supply to the solution treating units while the solution treating units are engaged in the solution treatment. The treatment quality in the solution treating units can be improved further conveniently.

In the above invention, it is preferred that the substrate treating apparatus further comprises individual gas exhaust devices provided to correspond individually to the solution treating units, each for exhausting gas at a variable rate only from one of the solution treating units. The substrate treating apparatus has individual gas exhaust devices. The individual gas exhaust devices are provided to correspond individually to the solution treating units. Therefore, the substrate treating apparatus has a plurality of individual gas exhaust devices. Each individual gas exhaust device is related to one of the solution treating units. The individual gas exhaust devices exhaust gas only from the solution treating units corresponding to the individual gas exhaust devices. Further, the gas exhaust devices have an adjustable rate of gas exhaust from the solution treating units corresponding to the individual gas exhaust devices. Therefore, the rate of gas exhaust from the solution treating units is changeable for each solution treating unit. Consequently, an appropriate quantity of gas can be exhausted in appropriate timing from each solution treating unit. Therefore, the treatment quality in each solution treating unit can be improved conveniently.

In the above invention, it is preferred that the substrate treating apparatus further comprises chambers for housing the plurality of solution treating units; wherein the solution treating units housed in each same chamber are arranged to perform the same type of solution treatment of the substrates. The substrate treating apparatus has chambers. Each chamber houses a plurality of solution treating units. The plurality of solution treating units arranged in the same chamber perform the same type of solution treatment of the substrates. This can improve the treatment quality of each solution treating unit with increased convenience. Here, "the same type of solution treatment" is, for example, a treatment performed by supplying the substrates with the same type of treating solution.

A substrate treating apparatus, in another aspect of this invention, comprises a plurality of solution treating units for performing solution treatment of substrates; and individual gas exhaust devices provided individually to correspond to the solution treating units, each for exhausting gas at a variable rate only from one of the solution treating units.

The substrate treating apparatus according to this invention has a plurality of solution treating units and a plurality of individual gas exhaust devices. The solution treating units perform solution treatment. The solution treatment is a treatment carried out by supplying the substrates with a treating solution. The individual gas exhaust devices are provided individually for the solution treating units. Each gas exhaust device is related to one of the solution treating units. The individual gas exhaust devices exhaust gas only from the solution treating units corresponding to the individual gas exhaust devices. Further, the gas exhaust devices have an adjustable rate of gas exhaust from the solution treating units corresponding to the individual gas exhaust devices. Therefore, the rate of gas exhaust from the solution treating units is changeable for each solution treating unit. Consequently, an appropriate quantity of gas can be exhausted in appropriate timing from each solution treating unit. Therefore, the treatment quality in each solution treating unit can be improved conveniently.

In the above invention, it is preferred that each of the individual gas exhaust devices includes an exhaust adjuster for adjusting the rate of gas exhaust from one of the solution treating units. The individual gas exhaust devices with the exhaust adjusters can conveniently adjust the rate of gas exhaust from the solution treating units.

In the above invention, it is preferred that the substrate treating apparatus further comprises collecting pipes provided to correspond individually to solution treating unit groups each formed of a plurality of the solution treating units arranged in a column substantially in an up-down direction, for collecting the gas only from a plurality of the individual gas exhaust devices corresponding to each solution treating unit group. A plurality of solution treating units arranged in a column substantially in the up-down direction constitute one solution treating unit group. The collecting pipes are provided individually for the solution treating unit groups. Each collecting pipe is related to one of the solution treating unit groups. As a result, each collecting pipe is related to the plurality of solution treating units belonging to one solution treating unit group, and the plurality of individual gas exhaust devices that exhaust gas from these solution treating units. Each collecting pipe collects gas only from the plurality of individual gas exhaust devices corresponding to the collecting pipe. For example, each collecting pipe is connected only to the plurality of individual gas exhaust devices corresponding to the collecting pipe. The plurality of individual gas exhaust devices corresponding to the same collecting pipe exhaust the gas, respectively, from the plurality of solution treating units arranged in a column substantially in the up-down direction. Therefore, the shape, size, direction and so on of the individual gas exhaust devices can easily be uniformed among the individual gas exhaust devices corresponding to the same collecting pipe. As a result, the rates of gas exhaust can be prevented conveniently from interfering with one another among the individual gas exhaust devices corresponding to the same collecting pipe. For example, the rate of gas exhaust from part of the individual gas exhaust devices can be prevented conveniently from causing variations in the rates of gas exhaust from the other individual gas exhaust devices. When the rate of gas exhaust from part of the individual gas exhaust devices is changed intentionally, for example, this change can be prevented conveniently from inadvertently varying the rate of gas exhaust from the other individual gas exhaust devices. Since the collecting pipe collects the gas from a plurality of individual gas exhaust devices, the individual gas exhaust devices can be reduced in size.

In the above invention, it is preferred that the plurality of individual gas exhaust devices are separated from one another at least inside the substrate treating apparatus. In other words, the individual gas exhaust devices are not connected directly or indirectly to one another at least inside the substrate treating apparatus. According to such a construction of the individual gas exhaust devices, whether the individual gas exhaust devices have exhaust adjusters or not, the rate of gas exhaust from the solution treating units can conveniently be changed for each solution treating unit. For example, even where the individual gas exhaust devices do not have exhaust adjusters, the rate of gas exhaust in the individual gas exhaust devices can be adjusted for each individual gas exhaust device by using external equipment. Consequently, the rate of gas exhaust from the solution treating units can be changed conveniently for each solution treating unit. The external equipment here is gas exhausting external equipment installed outside the substrate treating apparatus for exhausting the gas.

In the above invention, it is preferred that each of the individual gas exhaust devices includes an exhaust port for connection to external equipment installed outside the substrate treating apparatus; and an exhaust pipe connected to the exhaust port for transmitting the gas. Since each individual gas exhaust device has an individual exhaust port, the individual gas exhaust device can be connected easily to the external equipment. Since each individual gas exhaust device has an exhaust pipe, the individual gas exhaust device can conveniently send the gas exhausted from the solution treating unit to the external equipment. Here, the external equipment, more strictly, is gas exhausting external equipment.

In the above invention, it is preferred that the solution treating units include cups for surrounding side areas of the substrates under treatment; the individual gas exhaust devices are arranged to exhaust gas from inside the cups. Each individual gas exhaust device exhausts only the gas in the solution treating unit corresponding to that individual gas exhaust device. With this arrangement, the individual gas exhaust devices can conveniently exhaust gas from the solution treating units.

In the above invention, it is preferred that the individual gas exhaust devices include exhaust pipes connected to the cups; and a plurality of the exhaust pipes respectively connected to a plurality of cups adjoining each other substantially in a horizontal direction extend in mutually different directions from the cups. The exhaust pipe of each individual gas exhaust device is connected only to the cup of the solution treating unit corresponding to that individual gas exhaust device. Consequently, the individual gas exhaust device is conveniently connectable to the cup. Where a plurality of cups are arranged to adjoin each other substantially in a horizontal direction, a plurality of individual gas exhaust devices connected to these cups extend in mutually different directions from the cups. Consequently, the plurality of individual gas exhaust devices can be prevented conveniently from approaching each other. Therefore, even where the plurality of cups adjoin each other substantially in the horizontal direction, interference of the rates of gas exhaust can be prevented conveniently between the plurality of individual gas exhaust devices.

The exhaust pipes and cups may be connected directly or may be connected indirectly.

In the above invention, it is preferred that the substrate treating apparatus further comprises a controller for controlling the rate of gas exhaust at which the individual gas exhaust devices exhaust the gas from the solution treating units; wherein the controller changes individually the rate of gas exhaust from each of the solution treating units. The controller controls the rate of gas exhaust in the individual gas exhaust devices for each individual gas exhaust device. Consequently, the rate of gas exhaust from the solution treating units is changed for each solution treating unit. This can conveniently improve the quality of solution treatment of the substrates performed by each solution treating unit.

In the above invention, it is preferred that the controller changes the rate of gas exhaust from the solution treating units while the solution treating units are engaged in the solution treatment. The treatment quality in the solution treating units can be improved further conveniently.

This specification also discloses the following aspect of the invention relating to the substrate treating apparatus:

(1) In the above invention, it is preferred that the distributing pipes are installed to extend in the up-down direction in positions laterally of the solution treating unit groups.

According to the invention in paragraph (1) above, the solution treating units belonging to the same solution treating unit group are located substantially in the same direction relative to the distributing pipe corresponding to that solution treating unit group. Further, the solution treating units belonging to the same solution treating unit group are spaced substantially the same distance from the distributing pipe corresponding to that solution treating unit group. Therefore, the shape, size, direction and so on of the individual gas supply devices can further easily be uniformed among the plurality of individual gas supply devices corresponding to the same solution treating unit group.

(2) In the above invention, it is preferred that the collecting pipes are installed to extend in the up-down direction in positions laterally of the solution treating unit groups.

According to the invention in paragraph (2) above, the solution treating units belonging to the same solution treating unit group are located substantially in the same direction relative to the collecting pipe corresponding to that solution treating unit group. Further, the solution treating units belonging to the same solution treating unit group are spaced substantially the same distance from the collecting pipe corresponding to that solution treating unit group. Therefore, the shape, size, direction and so on of the individual gas exhaust devices can further easily be uniformed among the plurality of individual gas exhaust devices corresponding to the same collecting pipe.

(3) In the above invention, it is preferred that the substrate treating apparatus further comprises distributing pipes provided to correspond individually to blowout unit groups each formed of a plurality of blowout units arranged in a column substantially in an up-down direction, for distributing the gas only to a plurality of the individual gas supply devices corresponding to the blowout unit group.

According to the invention in paragraph (3) above, a plurality of blowout units arranged in a column substantially in the up-down direction constitute one blowout unit group. The distributing pipes are provided individually for the blowout unit groups. Each distributing pipe is related to one of the blowout unit groups. As a result, each distributing pipe is related to the plurality of blowout units belonging to one blowout unit group, and the plurality of individual gas supply devices connected to these blowout units. Each distributing pipe distributes gas only to the plurality of individual gas supply devices corresponding to the distributing pipe. For example, each distributing pipe is connected only to the plurality of individual gas supply devices corresponding to the distributing pipe. The plurality of individual gas supply devices corresponding to the same distributing pipe supply the gas, respectively, to the plurality of blowout units arranged in a column substantially in the up-down direction. Therefore, the shape, size, direction and so on of the individual gas supply devices can easily be uniformed among the plurality of individual gas supply devices corresponding to the same distributing pipe. As a result, the rates of gas supply can be prevented conveniently from interfering with one another among the individual gas supply devices corresponding to the same distributing pipe.

(4) In the above invention, it is preferred that the distributing pipes are installed to extend in the up-down direction in positions laterally of the blowout unit groups.

According to the invention in paragraph (4) above, the blowout units belonging to the same blowout unit group are located substantially in the same direction relative to the distributing pipe corresponding to that blowout unit group. Further, the blowout units belonging to the same blowout unit group are spaced substantially the same distance from the distributing pipe corresponding to that blowout unit group. Therefore, the shape, size, direction and so on of the individual gas supply devices can further easily be uniformed among the plurality of individual gas supply devices corresponding to the same blowout unit group.

(5) In the above invention, it is preferred that the substrate treating apparatus further comprises collecting pipes provided to correspond individually to cup groups each formed of a plurality of cups arranged in a column substantially in an up-down direction, for collecting the gas only from a plurality of the individual gas exhaust devices corresponding to the cup group.

According to the invention in paragraph (5) above, a plurality of cups arranged in a column substantially in the up-down direction constitute one cup group. Each collecting pipe is related to one of the cup groups. As a result, each collecting pipe is related to the plurality of cups belonging to one cup group, and the plurality of individual gas exhaust devices connected to these cups. Each collecting pipe collects gas only from the individual gas exhaust devices corresponding to the collecting pipe. For example, each collecting pipe is connected only to the plurality of individual gas exhaust devices corresponding to the collecting pipe. The plurality of individual gas exhaust devices corresponding to the same collecting pipe exhaust the gas, respectively, from the plurality of cups arranged in a column substantially in the up-down direction. Therefore, the shape, size, direction and so on of the individual gas exhaust devices can easily be uniformed among the plurality of individual gas exhaust devices corresponding to the same collecting pipe. As a result, the rates of gas exhaust can be prevented conveniently from interfering with one another among the individual gas exhaust devices corresponding to the same collecting pipe.

(6) In the above invention, it is preferred that the collecting pipes are installed to extend in the up-down direction in positions laterally of the cup groups.

According to the invention in paragraph (6) above, the cups belonging to the same cup group are located substantially in the same direction relative to the collecting pipe corresponding to that cup group. Further, the cups belonging to the same cup group are spaced substantially the same distance from the collecting pipe corresponding to that cup group. Therefore, the shape, size, direction and so on of the individual gas exhaust devices can further easily be uniformed among the plurality of individual gas exhaust devices corresponding to the same cup group.

(7) In the above invention, it is preferred that the controller is arranged to change individually the rate of gas supply to each solution treating unit according to operation of each solution treating unit.

According to the invention in paragraph (6) above, the treatment quality of each solution treating unit can be improved further conveniently. Here, the term "operation of the solution treating unit" includes, for example, the solution treating unit performing solution treatment of the substrates with a treating solution, and the solution treating unit being on standby instead of treating the substrates with a treating solution. The term "the solution treating unit performing solution treatment of the substrates" includes, for example, the solution treating unit starting solution treatment, the solution treating unit finishing solution treatment, and various operations of the solution treating unit during a period from start to finish of the solution treatment. The term "the solution treating unit being on standby" includes, for example, loading of the substrates into the solution treating unit, unloading of the substrates from the solution treating unit, changing of the substrates in the solution treating unit, and the solution treating unit coming to rest/stopping and so on.

(8) In the above invention, it is preferred that the controller changes the rate of gas supply to the solution treating units while the solution treating units are engaged in the solution treatment, based on one of an elapsed time from a starting time of the solution treatment and a treatment condition for the solution treatment.

According to the invention in paragraph (8) above, an appropriate quantity of gas can be supplied in appropriate timing to the solution treating units. Here, the "treatment condition for the solution treatment" includes, for example, discharge timing of a treating solution, discharge rate of the treating solution, rotation speed of the substrate and so on.

(9) In the above invention, it is preferred that the controller is arranged to change individually the rate of gas exhaust from each solution treating unit according to operation of each solution treating unit.

According to the invention in paragraph (9) above, the treatment quality of each solution treating unit can be improved further conveniently.

(10) In the above invention, it is preferred that the controller changes the rate of gas exhaust from the solution treating units while the solution treating units are engaged in the solution treatment, based on one of an elapsed time from a starting time of the solution treatment and a treatment condition for the solution treatment.

According to the invention in paragraph (10) above, an appropriate quantity of gas can be exhausted in appropriate timing from the solution treating units.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

An embodiment of this invention will be described hereinafter with reference to the drawings.

<Outline of Substrate Treating Apparatus>

Figure 1:
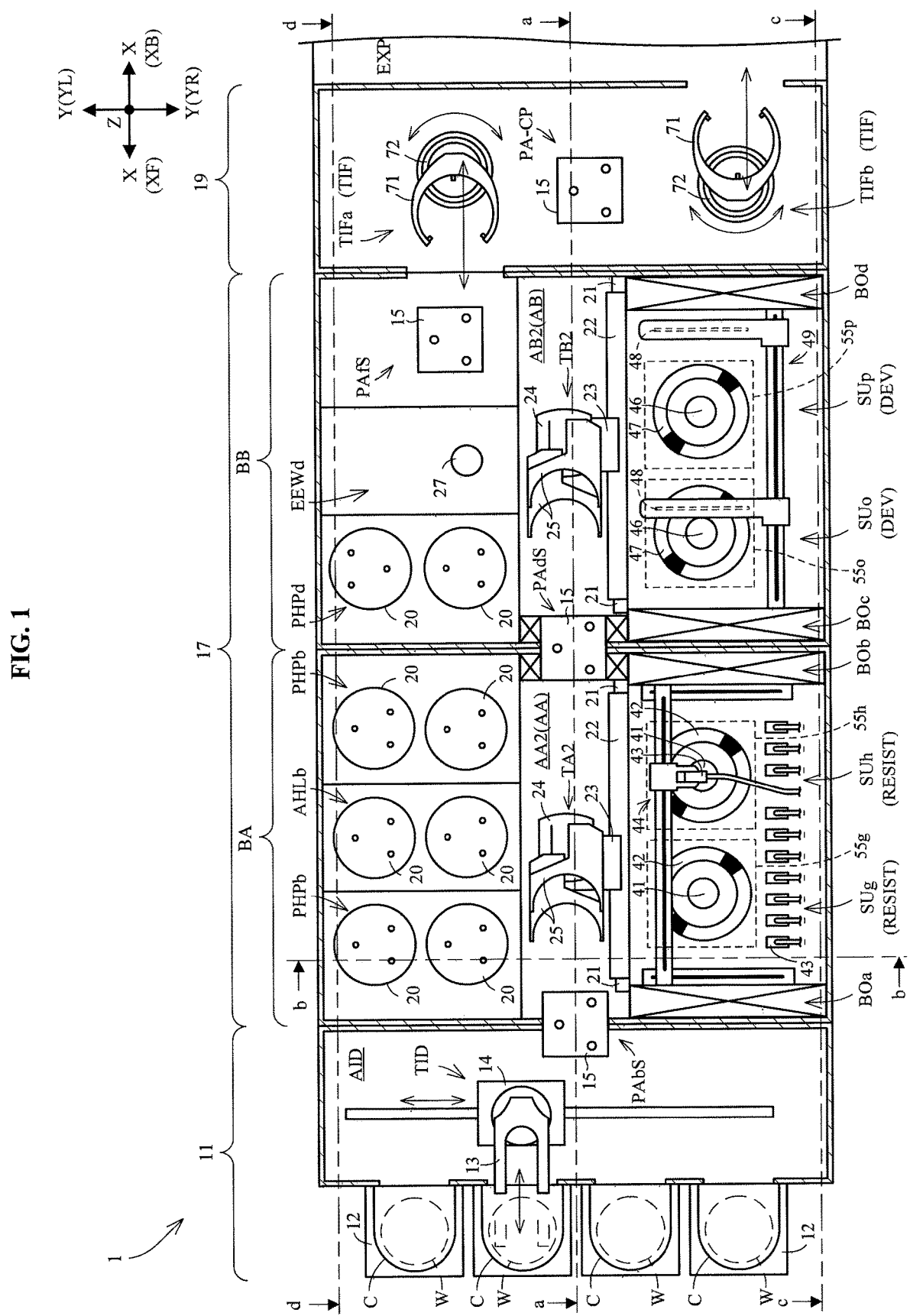
FIG. 1 is a plan view of a substrate treating apparatus according to this invention.

FIG. 1 is a plan view of a substrate treating apparatus according to this invention. A substrate treating apparatus 1 treats wafers W. The "wafers W" here means semiconductor wafers, glass substrates for photomasks, glass substrates for liquid crystal displays, substrates for plasma displays, substrates for optical disks, substrates for magnetic disks, substrates for magneto-optical disks and so on (hereinafter called simply wafers).

The substrate treating apparatus 1 includes an indexer section 11, a treating section 17 and an interface section 19. The indexer section 11 is connected to the treating section 17. The indexer section 11 feeds the wafers W to the treating section 17. The treating section 17 performs solution treatment in which treating solutions are supplied to the wafers W, for example. The interface section 19 is connected to the treating section 17. Further, the interface section 19 is connected to an exposing machine EXP which is provided separately from the substrate treating apparatus 1. The interface section 19 transports the wafers W between the treating section 17 and exposing machine EXP. The exposing machine EXP performs exposing treatment of the wafers W.

The indexer section 11, treating section 17, interface section 19 and exposing machine EXP are arranged in this order in a row.

In this specification, the direction in which the indexer section 11, treating section 17 and interface section 19 are arranged is called "fore-and-aft direction X". The fore-and-aft direction X is horizontal. In particular, a direction pointing from the interface section 19 toward the indexer section 11 is called "forward XF", and the direction opposite to forward XF is called "backward XB". The horizontal direction perpendicular to the fore-and-aft direction X is called "width direction Y". One direction of the "width direction Y" is called "rightward YR", and the other direction opposite to rightward YR is called "leftward YL". The vertical direction is called "up-down direction Z". The fore-and-aft direction X and width direction Y, when not particularly distinguished, are written simply "laterally" or "in the horizontal direction".

The treating section 17 includes two treating blocks BA and BB. The treating blocks BA and BB perform the solution treatment and the like of the wafers W, respectively. The treating block BA and treating block BB are arranged in a row in the fore-and-aft direction X. The treating block BA is disposed forward XF of the treating block BB. The treating block BA and treating block BB are connected to each other. The treating block BA and treating block BB can transport the wafers W reciprocally. The indexer section 11 is connected to the treating block BA. The interface section 19 is connected to the treating block BB.

<Indexer Section 11>

Figure 2:
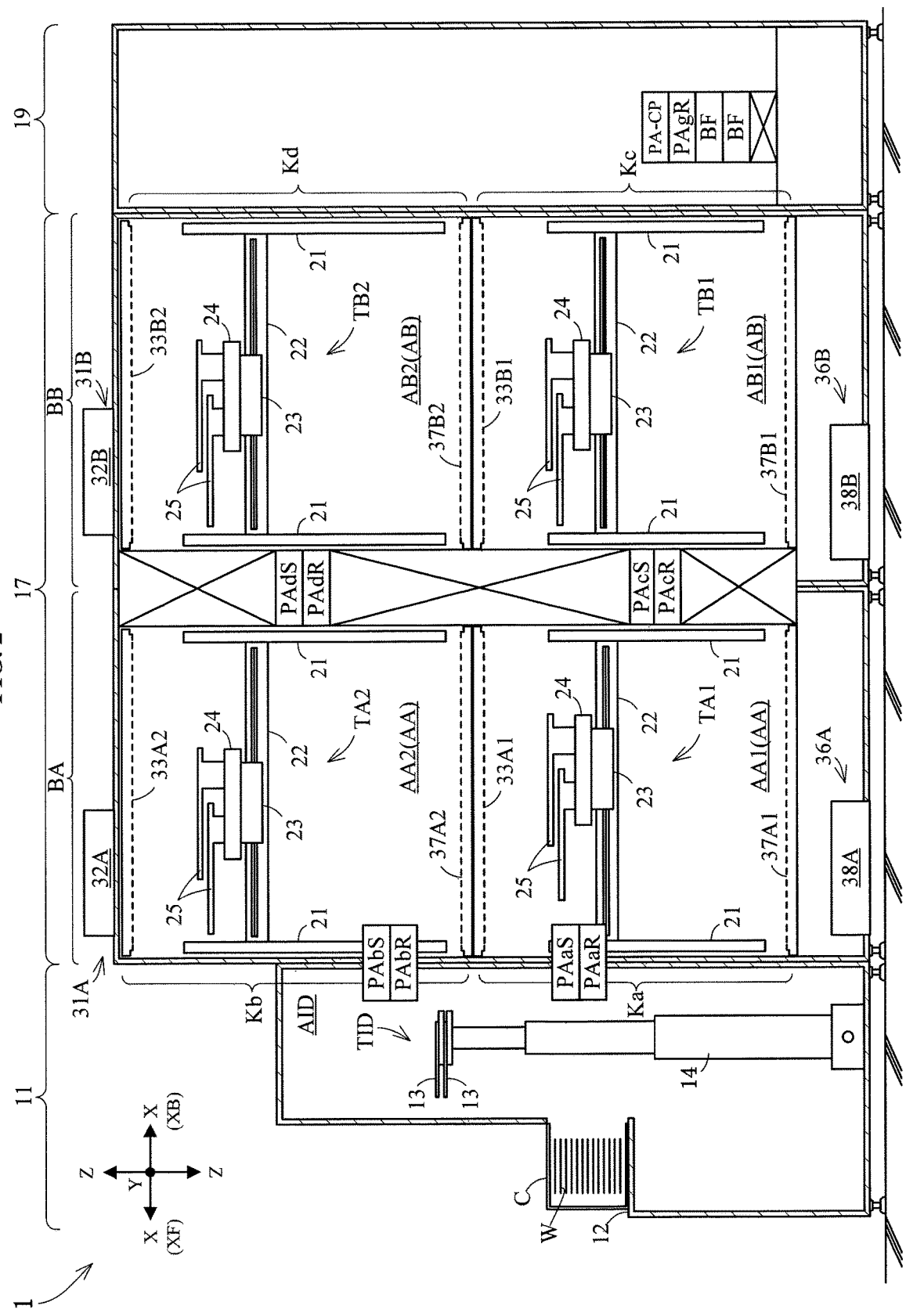
FIG. 2 is a side view taken on line a-a of FIG. 1.

Reference is made to FIGS. 1 and 2. FIG. 2 is a side view taken on line a-a of FIG. 1.

The indexer section 11 has carrier tables 12, a transporting space AID and an indexer's transport mechanism TID.

The carrier tables 12 receive and hold carriers C. The carriers C are placed on the carrier tables 12 by an unillustrated external transport mechanism, for example. Each carrier C stores a plurality of wafers W. The carriers C are FOUPs (front opening unified pods), for example.

The transporting space AID is provided backward XB of the carrier tables 12. The indexer's transport mechanism TID is installed in the transporting space AID. The indexer's transport mechanism TID transports the wafers W out of the carriers C and into the carriers C. Further, the indexer's transport mechanism TID passes the wafers W to the treating section 17, and receives the wafers W from the treating section 17.

The indexer's transport mechanism TID is what is called a transport robot. For example, the indexer's transport mechanism TID has two hands 13 for holding wafers W, and a hand drive mechanism 14 for driving each hand 13. The hands 13 hold one wafer W each. The hand drive mechanism 14 moves the hands 13 in the fore-and-aft direction X, width direction Y and up-down direction Z, and rotates the hands 13 about the up-down direction Z. Thus, the indexer's transport mechanism TID accesses the carriers C and the treating block BA.

<Basic Construction of Treating Block BA>

Reference is made to FIG. 1. The treating block BA has a transporting space AA for transporting wafers W. The transporting space AA, in plan view, is located at the middle in the width direction Y of the treating block BA. The transporting space AA, in plan view, extends in the fore-and-aft direction X.

Figure 3:
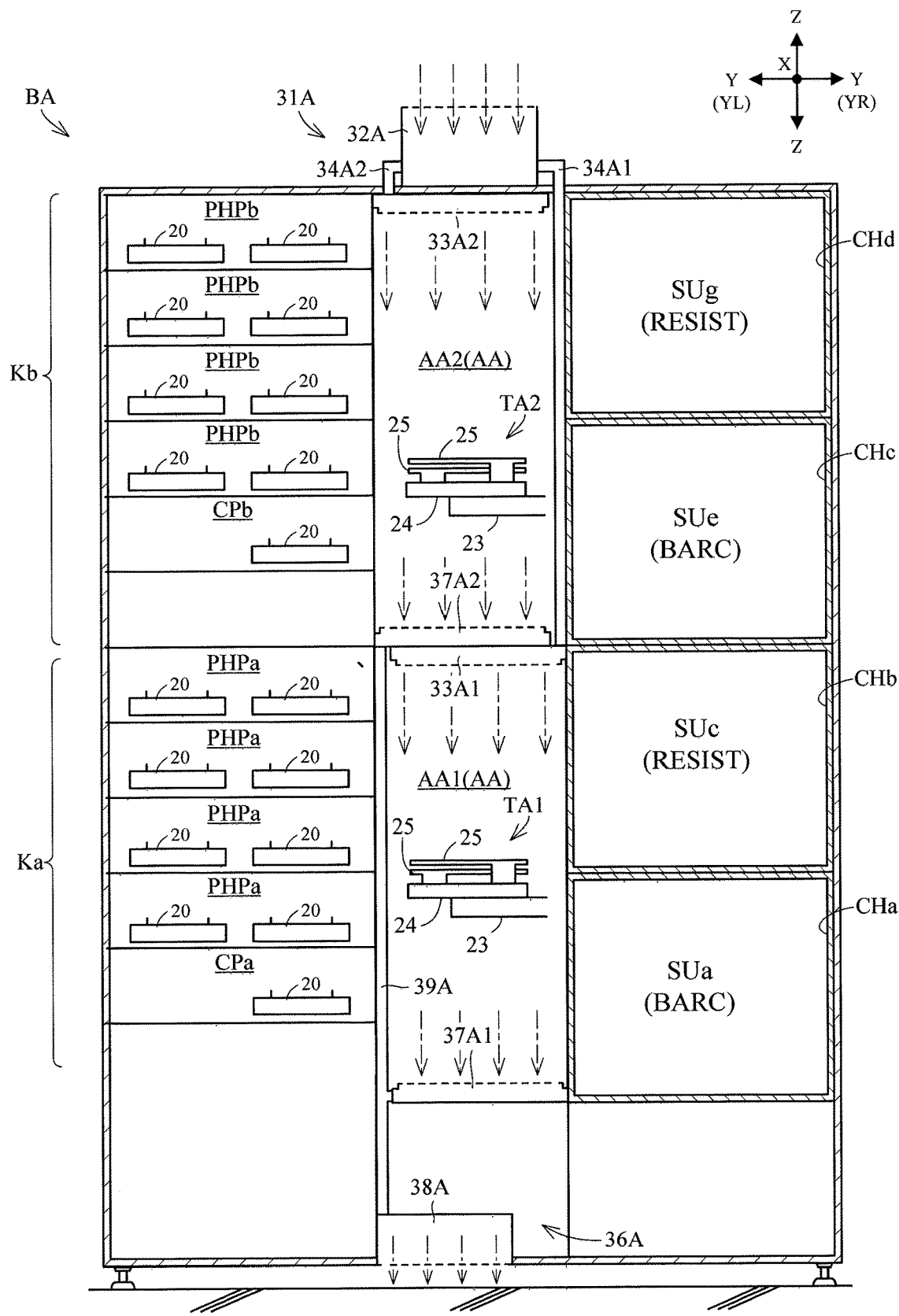
FIG. 3 is a front view taken on line b-b of FIG. 1.

Reference is made to FIGS. 2 and 3. FIG. 3 is a front view taken on line b-b of FIG. 1. The transporting space AA is split into a plurality of divided transporting spaces AA1 and AA2. The divided transporting space AA1 corresponds to a lower part of the transporting space AA. The divided transporting space AA2 corresponds to an upper part of the transporting space AA. The divided transporting spaces AA1 and AA2 are arranged in the up-down direction Z. The divided transporting spaces AA1 and AA2 are arranged in this order from bottom upward.

A main transport mechanism TA1 is installed in the divided transporting space AA1. A main transport mechanism TA2 is installed in the divided transporting space AA2. The main transport mechanisms TA1 and TA2 transport wafers W, respectively. The main transport mechanism TA1 moves within the divided transporting space AA1, and does not reach out into the other divided transporting space AA2. Similarly, the main transport mechanism TA2 moves within the divided transporting space AA2, and does not reach out into the other divided transporting space AA1.

Figure 4:
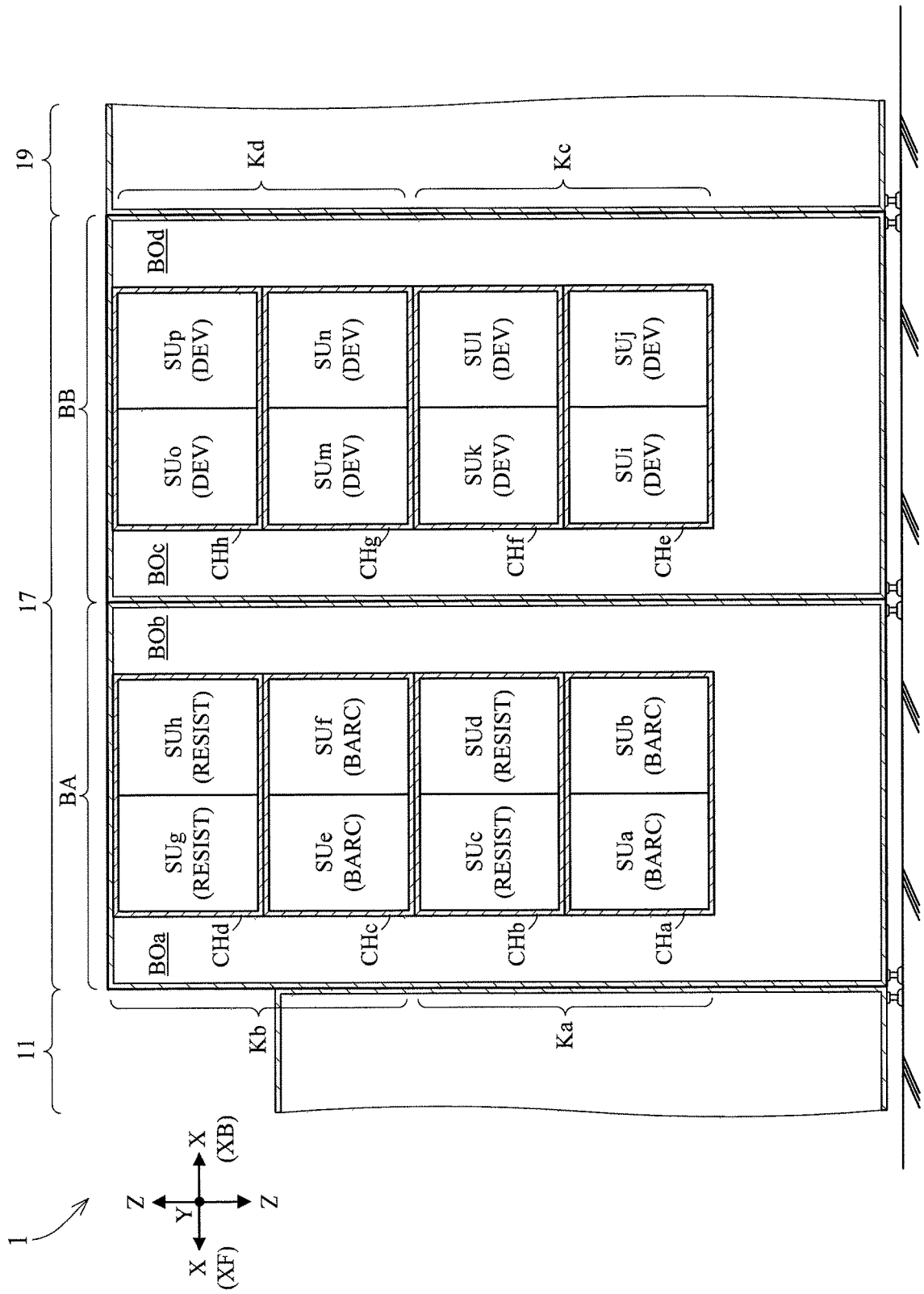
FIG. 4 is a side view taken on line c-c of FIG. 1.

Reference is made to FIGS. 1, 3 and 4. FIG. 4 is a side view taken on line c-c of FIG. 1. The treating block BA has a plurality of (e.g. eight) solution treating units SUa-SUh. The solution treating units SUa-SUh are arranged laterally (rightward YR) of the transporting space AA. The solution treating units SUa-SUd are arranged laterally (rightward YR) of the divided transporting space AA1. The solution treating units SUe-SUh are arranged laterally (rightward YR) of the divided transporting space AA2.

The solution treating units SUa-SUh are arranged in a matrix form, substantially in the horizontal direction (e.g. in the fore-and-aft direction X) and substantially in the up-down direction Z. Specifically, the solution treating units SUa and SUb are arranged substantially in the horizontal direction. Similarly, the solution treating units SUc and SUd are arranged substantially in the horizontal direction. The solution treating units SUe and SUf are arranged substantially in the horizontal direction. The solution treating units SUg and SUh are arranged substantially in the horizontal direction. The solution treating units SUa, SUc, SUe and SUg are arranged in a column substantially in the up-down direction Z. The solution treating units SUa, SUc, SUe and SUg constitute a columnar group of solution treating units SU (hereinafter called simply "solution treating unit group"). The solution treating units SUb, SUd, SUf and SUh are arranged in a column substantially in the up-down direction Z. The solution treating units SUb, SUd, SUf and SUh constitute one solution treating unit group.

Each of the solution treating units SUa-SUh performs solution treatment. The solution treatment is treatment carried out by supplying the wafers W with treating solutions. The solution treatment carried out by each of the solution treating units SUa-SUh is coating treatment. The coating treatment applies a treating solution to the wafers W to form coating film on the surfaces of the wafers W.

More particularly, the solution treating units SUa, SUb, SUe and SUf carry out antireflection film forming treatment. The antireflection film forming treatment is a treatment for forming antireflection film on the surfaces of the wafers W by applying an antireflection film material to the wafers W. That is, the solution treating units SUa, SUb, SUe and SUf are antireflection film coating units BARC. The solution treating units SUc, SUd, SUg and SUh carry out resist film forming treatment. The resist film forming treatment is a treatment for forming resist film on the surfaces of the wafers W by applying a resist film material to the wafers W. That is, the solution treating units SUc, SUd, SUg and SUh are resist film coating units RESIST.

Reference is made to FIGS. 3 and 4. The treating block BA has chambers CHa, CHb, CHc and CHd. The chambers CHa-CHd are arranged laterally (rightward YR) of the transporting space AA. The chambers CHa-CHd are arranged in the up-down direction Z. The chamber CHa houses the solution treating units SUa and SUb. The solution treating unit SUa and solution treating unit SUb are arranged in the same space. The solution treating unit SUa and solution treating unit SUb adjoin each other substantially in the horizontal direction. That is, the solution treating unit SUa and solution treating unit SUb face each other substantially in the horizontal direction. The solution treating unit SUa and solution treating unit SUb are not separated by a partition wall or the like. Similarly, the chamber CHb houses the solution treating units SUc and SUd. The chamber CHc houses the solution treating units SUe and SUf. The chamber CHd houses the solution treating units SUg and SUh.

In each of the chambers CHa-CHd, the same type of solution treatment is carried out. For example, the solution treating units SUa and SUb housed in the chamber CHa carry out the same type of solution treatment (specifically, the antireflection film forming treatment). The solution treating units SUa and SUb carry out the solution treatment in the same space. Similarly, the solution treating units SUc and SUd housed in the chamber CHb carry out the same type of solution treatment (specifically, the resist film forming treatment). The solution treating units SUe and SUf housed in the chamber CHc carry out the same type of solution treatment (specifically, the antireflection film forming treatment). The solution treating units SUg and SUh housed in the chamber CHd carry out the same type of solution treatment (specifically, the resist film forming treatment).

Figure 5:
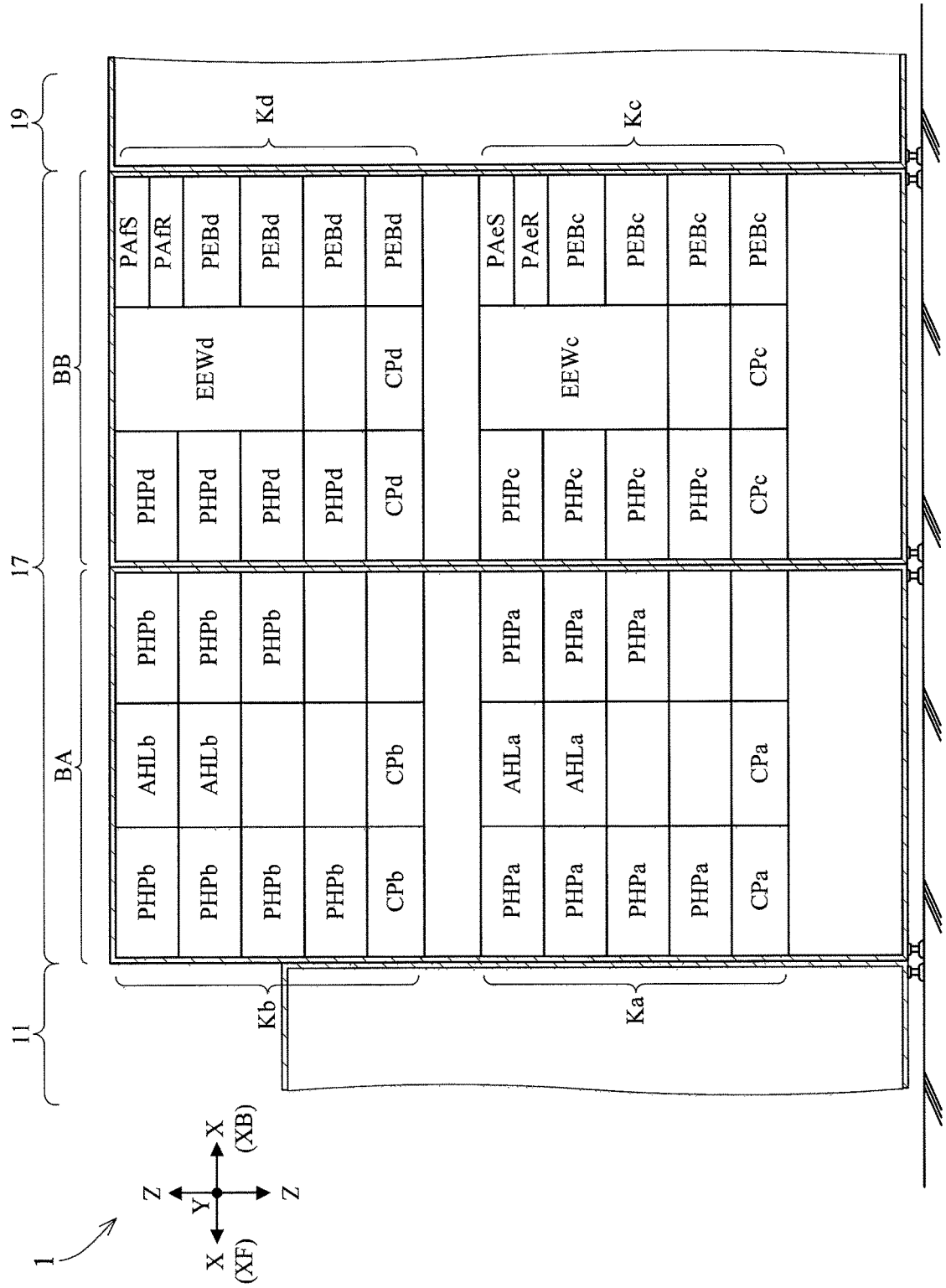
FIG. 5 is a side view taken on line d-d of FIG. 1.

Reference is made to FIGS. 1, 3 and 5. FIG. 5 is a side view taken on line d-d of FIG. 1. The treating block BA has various heat-treating units CPa, CPb, PHPa, PHPb, AHLa and AHLb. The heat-treating units CPa, CPb, PHPa, PHPb, AHLa and AHLb are arranged laterally (leftward YL) of the transporting space AA.

The heat-treating units CPa, CPb, PHPa, PHPb, AHLa and AHLb are arranged in a matrix form, in the fore-and-aft direction X and the up-down direction Z. The heat-treating units CPa, PHPa and AHLa are arranged laterally (leftward YL) of the divided transporting space AA1. The heat-treating units CPb, PHPb and AHLb are arranged laterally (leftward YL) of the divided transporting space AA2. The arrangement of the heat-treating units CPa relative to the divided transporting space AA1, preferably, is equal to the arrangement of the heat-treating units CPb relative to the divided transporting space AA2. Similarly, the arrangement of the heat-treating unit PHPa relative to the divided transporting space AA1, preferably, is equal to the arrangement of the heat-treating units PHPb relative to the divided transporting space AA2. The arrangement of the heat-treating units AHLa relative to the divided transporting space AA1, preferably, is equal to the arrangement of the heat-treating units AHLb relative to the divided transporting space AA2.

Each of the heat-treating units CPa, CPb, PHPa, PHPb, AHLa and AHLb performs heat treatment of the wafers W. Specifically, the heat-treating units CPa and CPb carry out cooling treatment for cooling the wafers W. The heat-treating units PHPa and PHPb carry out heating and cooling treatment to heat the wafers W and then cool the wafers W. The heat-treating units AHLa and AHLb perform hydrophobic treatment, which is a heat treatment carried out in a vapor atmosphere of hexamethyldisilazane (HMDS) in order to enhance film adhesion to the wafers W. Each of the heat-treating units CPa, CPb, PHPa, PHPb, AHLa and AHLb has a plate 20 and other elements for holding a wafer W.

The main transport mechanism TA1 transports wafers W to the solution treating units SUa-SUd and the heat-treating units CPa, PHPa and AHLa. The main transport mechanism TA2 transports wafers W to the solution treating units SUe-SUh and the heat-treating units CPb, PHPb and AHLb.

As is clear from the above description, the treating block BA has a multistory structure including a plurality of (e.g. two) stories Ka and Kb arranged in the up-down direction Z. The story Ka has installed thereon the main transport mechanism TA1, the solution treating units SUa-SUd to which the main transport mechanism TA1 transports wafers W, and the heat-treating units CPa, PHPa and AHLa to which the main transport mechanism TA1 transports wafers W. The story Kb has installed thereon the main transport mechanism TA2, the solution treating units SUe-SUh to which the main transport mechanism TA2 transports wafers W, and the heat-treating units CPb, PHPb and AHLb to which the main transport mechanism TA2 transports wafers W. Each of the stories Ka and Kb carries out transportation and treatment of the wafers W. Operations of the stories Ka and Kb are independent of each other.

Reference is made to FIGS. 1 and 2. The substrate treating apparatus 1 has receivers PAaS, PAaR, PAbS and PAbR for placing wafers W thereon. The receivers PAaS, PAaR, PAbS and PAbR are arranged between the indexer section 11 and treating block BA. Specifically, the receivers PAaS and PAaR are installed to interconnect the transporting space AID and divided transporting space AA1. The receivers PAbS and PAbR are installed to interconnect the transporting space AID and divided transporting space AA2. Each of the receivers PAaS, PAaR, PAbS and PAbR has a plate 15 or the like on which a wafer W is placed.

The indexer's transport mechanism TID and main transport mechanism TA1 reciprocally transfer wafers W using the receivers PAaS and PAaR. For example, the receiver PAaS is used when the indexer's transport mechanism TID passes the wafers W to the main transport mechanism TA1. The receiver PAaR is used when the indexer's transport mechanism TID receives the wafers W from the main transport mechanism TA1. Similarly, the indexer's transport mechanism TID and main transport mechanism TA2 reciprocally transfer wafers W using the receivers PAbS and PAbR.

<Basic Construction of Treating Block BB>

A construction of the treating block BB will be described. Since the treating block BB has a similar construction to the treating block BA, description of the treating block BB will be omitted as appropriate.

Reference is made to FIG. 1. The treating block BB has a transporting space AB. The transporting space AB, in plan view, is disposed at the middle in the width direction Y of the treating block BB. The transporting space AB is disposed backward XB of the transporting space AA. The transporting space AB borders on the transporting space AA. The transporting space AB is connected to the transporting space AA.

Reference is made to FIG. 2. The transporting space AB is split into a plurality of divided transporting spaces AB1 and AB2. The divided transporting spaces AB1 and AB2 are arranged in the up-down direction Z. The divided transporting space AB1 corresponds to a lower part of the transporting space AB. The divided transporting space AB1 is disposed in the same height position as the divided transporting space AA1. The divided transporting space AB1 is connected to the divided transporting space AA1. The divided transporting space AB2 corresponds to an upper part of the transporting space AB. The divided transporting space AB2 is disposed in the same height position as the divided transporting space AA2. The divided transporting space AB2 is connected to the divided transporting space AA2.

The treating block BB has main transport mechanisms TB1 and TB2. The main transport mechanism TB1 is installed in the divided transporting space AB1. The main transport mechanism TB2 is installed in the divided transporting space AB2.

Receivers PAcS, PAcR, PAdS and PAdR are arranged between the treating block BA and treating block BB. Specifically, the receivers PAcS and PAcR are installed to interconnect the divided transporting space AA1 and divided transporting space AB1. The receivers PAdS and PAdR are installed to interconnect the divided transporting space AA2 and divided transporting space AB2. The main transport mechanism TA1 and main transport mechanism TB1 reciprocally transfer wafers W using the receivers PAcS and PAcR. The main transport mechanism TA2 and main transport mechanism TB2 reciprocally transfer wafers W using the receivers PAdS and PAdR.

Reference is made to FIGS. 1 and 4. The treating block BB has a plurality of (e.g. eight) solution treating units SUi-SUp. The solution treating units SUi-SUp are arranged laterally (rightward YR) of the transporting space AB. The solution treating units SUi-SUl are arranged laterally (rightward YR) of the divided transporting space AB1. The solution treating units SUm-SUp are arranged laterally (rightward YR) of the divided transporting space AB2.

The solution treating units SUi-SUp are arranged in a matrix form, substantially in the horizontal direction (e.g. in the fore-and-aft direction X) and substantially in the up-down direction Z. Specifically, the solution treating units SUi and SUj are arranged substantially in the horizontal direction. The solution treating units SUk and SUl are arranged substantially in the horizontal direction. The solution treating units SUm and SUn are arranged substantially in the horizontal direction. The solution treating units SUo and SUp are arranged substantially in the horizontal direction. The solution treating units SUi, SUk, SUm and SUo are arranged in a column substantially in the up-down direction Z. The solution treating units SUi, SUk, SUm and SUo constitute one solution treating unit group. The solution treating units SUj, SUl, SUn and SUp are arranged in a column substantially in the up-down direction Z. The solution treating units SUj, SUl, SUn and SUp constitute one solution treating unit group.

Each of the solution treating units SUi-SUp performs solution treatment. The solution treatment carried out by each of the solution treating units SUi-SUp is developing treatment. The developing treatment is development carried out by applying a developer to the wafers W. That is, the solution treating units SUi-SUp are developing units DEV.

The treating block BB has chambers CHe, CHf, CHg and CHh. The chamber CHe houses the solution treating units SUi and SUj. The chamber CHf houses the solution treating units SUk and SUl. The chamber CHg houses the solution treating units SUm and SUn. The chamber CHh houses the solution treating units SUo and SUp.

In each of the chambers CHe-CHh, the same type of solution treatment (specifically, the developing treatment) is carried out.

In the following description, the solution treating units SUa-SUp, when not particularly distinguished, will be called simply "solution treating unit(s) SU". The chambers CHa-CHh, when not particularly distinguished, will be called simply "chamber(s) CH".

Reference is made to FIGS. 1 and 5. The treating block BB has heat-treating units CPc, CPd, PHPc, PHPd, PEBc and PEBd, edge exposing units EEWc and EEWd, and receivers PAeS, PAeR, PAfS and PAfR. These various units and receivers are arranged laterally (leftward YL) of the transporting space AB.

The heat-treating units CPc, PHPc and PEBc are arranged laterally (leftward YL) of the divided transporting space AB1. The heat-treating units CPd, PHPd and PEBd are arranged laterally (leftward YL) of the divided transporting space AB2. The edge exposing unit EEWc is disposed laterally (leftward YL) of the divided transporting space AB1. The edge exposing unit EEWd is disposed laterally (leftward YL) of the divided transporting space AB2. The receivers PAeS and PAeR are arranged laterally (leftward YL) of the divided transporting space AB1. The receivers PAfS and PAfR are arranged laterally (leftward YL) of the divided transporting space AB2.

Each of the heat-treating units CPc, CPd, PHPc, PHPd, PEBc and PEBd performs heat treatment of the wafers W. Specifically, the heat-treating units PEBc and PEBd perform post-exposure bake of wafers W after exposing treatment. The edge exposing units EEWc and EEWd expose edge portions of the resist film on the wafers W. Each of the edge exposing units EEWc and EEWd has a spin holder 27 (see FIG. 1) for rotatably holding a wafer W, and a light emitter (not shown) for exposing edges of the wafer held by the spin holder 27.

The heat-treating units PEBc and PEBd and the receivers PAeS, PAeR, PAfS and PAfR are arranged in a rear part of the treating block BB. The heat-treating units PEBc and PEBd and the receivers PAeS, PAeR, PAfS and PAfR border on the interface section 19.

The main transport mechanism TB1 transports wafers W to the solution treating units SUi-SUl, heat-treating units CPc and PHPc, edge exposing unit EEWc and receivers PAcS, PAcR, PAeS and PAeR. The main transport mechanism TB2 transports wafers W to the solution treating units SUm-SUp, heat-treating units CPd and PHPd, edge exposing unit EEWd and receivers PAdS, PAdR, PAfS and PAfR.

As is clear from the above description, the treating block BB has a multistory structure including a plurality of (e.g. two) stories Kc and Kd arranged in the up-down direction Z. The story Kc has installed thereon the main transport mechanism TB1, and the solution treating units SUi-SUl and so on to which the main transport mechanism TB1 transports wafers W. The story Kd has installed thereon the main transport mechanism TB2, and the solution treating units SUm-SUp and so on to which the main transport mechanism TA2 transports wafers W. Each of the stories Kc and Kd carries out transportation and treatment of the wafers W. Operations of the stories Kc and Kd are independent of each other.

<Detailed Construction of Main Transport Mechanisms, and Construction Relating to Gas Supply to and Gas Exhaust from Transporting Spaces>

A construction of the main transport mechanisms TA1, TA2, TB1 and TB2 will be described. The main transport mechanisms TA1, TA2, TB1 and TB2 have the same construction. The main transport mechanism TA2 will be described by way of example hereinafter.

Figure 6:
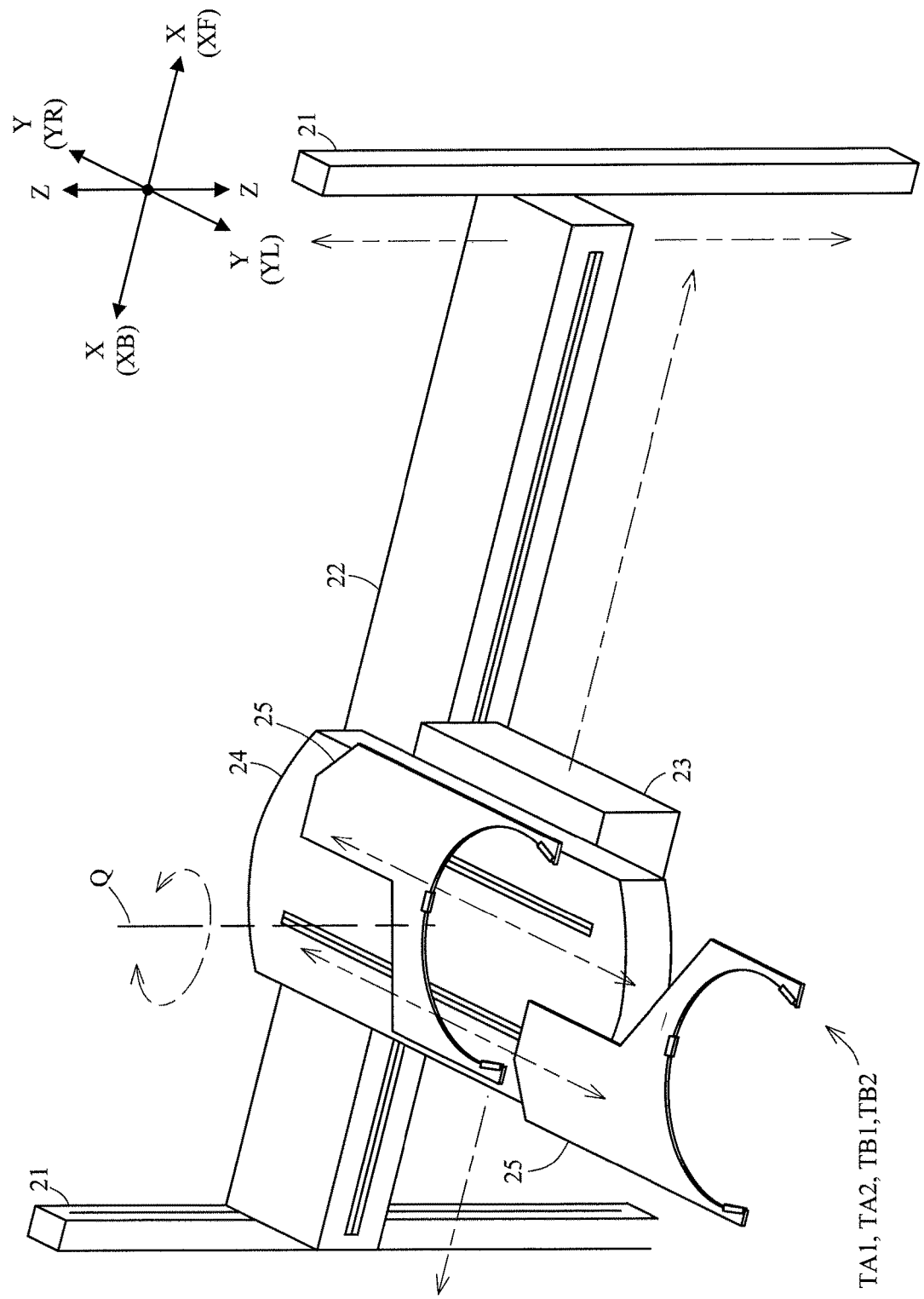
FIG. 6 is a perspective view of a main transport mechanism.

Reference is made to FIGS. 1, 2, 3 and 6. FIG. 6 is a perspective view of the main transport mechanism. The main transport mechanism TA2 has a pair of first guide rails 21, a second guide rail 22, a base 23, a turntable 24 and two hands 25.

The two first guide rails 21 are fixed to the side having the solution treating units SU of the divided transporting space AA2. For example, the two first guide rails 21 are arranged at a right forward portion and a right rearward portion of the divided transporting space AA2, respectively (see FIG. 1).

The two first guide rails 21 are installed to extend in the up-down direction Z, respectively. The two first guide rails 21 are opposed to each other in the fore-and-aft direction X. The second guide rail 22 is supported by the pair of first guide rails 21. Specifically, the second guide rail 22 is installed between the pair of first guide rails 21, and extends in the fore-and-aft direction X. The second guide rail 22 has opposite ends thereof connected to the first guide rails 21. The second guide rail 22 is movable in the up-down direction Z relative to the pair of first guide rails 21. The base 23 is supported by the second guide rail 22. The base 23 is movable in the fore-and-aft direction X relative to the second guide rail 22. The turntable 24 is supported by the base 23. The turntable 24 is rotatable relative to the base portion 23 about a vertical axis Q parallel to the up-down direction Z. The two hands 25 are supported by the turntable 24. Each hand 25 is movable forward and backward along one horizontal direction relative to the turntable 24. Each hand 25 holds one wafer W.

The main transport mechanism TA2 further includes various drive mechanisms for moving the second guide rail 22, base 23, turntable 24 and hands 25, respectively. The various drive mechanisms vertically move the second guide rail 22 in the up-down direction Z, move the base 23 in the fore-and-aft direction X, rotate the turntable 24 about the vertical axis Q, and move the hands 25 forward and backward. Consequently, the hands 25 move in the fore-and-aft direction X, width direction Y and up-down direction Z, and rotate about the vertical axis Q. And the hands 25 access the receivers PAbS, PAbR, PAdS and PAdR, solution treating units SU and heat-treating units AHL, CP and PHP provided on the story Kb.

A construction relating to gas supply to the transporting spaces AA and AB will be described. Reference is made to FIGS. 2 and 3. The substrate treating apparatus 1 has transporting space gas supply devices 31A and 31B. The gas supply device 31A supplies gas to the transporting space AA. The gas supply device 31B supplies gas to the transporting space AB.

The gas supply device 31A has a supply fan 32A. The supply fan 32A is installed outside the transporting space AA (e.g. on an upper part of the treating block BA). The supply fan 32A has a primary side thereof open to the exterior of the substrate treating apparatus 1. The supply fan 32A has a secondary side thereof communicating with the transporting space AA. The supply fan 32A takes in ambient gas from outside the substrate treating apparatus 1, and sends it into the transporting space AA. Preferably, the gas supply device 31A further includes a filter. The filter is a chemical adsorption filter or ULPA filter (Ultra Low Penetration Air Filter), for example. The filter is installed on the primary side or secondary side of the supply fan 32A. With this construction, the supply fan 32A can send clean gas into the transporting space AA.

The gas supply device 31A has blowout units 33A1 and 33A2. The blowout unit 33A1 blows out the gas to the divided transporting space AA1. The blowout unit 33A1 is installed in an upper part of the divided transporting space AA1. The blowout unit 33A1 has openings (blowout bores) formed in a lower surface thereof for blowing out the gas. Preferably, the blowout unit 33A1 in plan view has substantially the same expanse as the divided transporting space AA1. The supply fan 32A and blowout unit 33A1 are connected by a supply pipe 34A1. Similarly, the blowout unit 33A2 blows out gas to the divided transporting space AA2. The blowout unit 33A2 is installed in an upper part of the divided transporting space AA2. The blowout unit 33A2 has openings (blowout bores) formed in a lower surface thereof for blowing out the gas. Preferably, the blowout unit 33A2 in plan view has substantially the same expanse as the divided transporting space AA2. The supply fan 32A and blowout unit 33A2 are connected by a supply pipe 34A2.

The gas supply device 31B has the same construction as the gas supply device 31A. The gas supply device 31B has a supply fan 32B and blowout units 33B1 and 33B2. The supply fan 32B corresponds to the supply fan 32A. The blowout units 33B1 and 33B2 correspond to the blowout units 33A1 and 33A2, respectively.

A construction relating to gas exhaust from the transporting spaces AA and AB will be described. The substrate treating apparatus 1 has transporting space gas exhaust devices 36A and 36B. The exhaust device 36A exhausts gas from the transporting space AA. The exhaust device 36B exhausts gas from the transporting space AB.

The exhaust device 36A has suction units 37A1 and 37A2. The suction unit 37A1 sucks gas from the divided transporting space AA1. The suction unit 37A1 is installed in a lower part of the divided transporting space AA1. The suction unit 37A1 is opposed to the blowout unit 33A1 across the main transport mechanism TA1. The suction unit 37A1 has openings (suction bores) formed in an upper surface thereof for sucking the gas. Preferably, the suction unit 37A1 in plan view has substantially the same expanse as the divided transporting space AA1. The suction unit 37A2 sucks gas from the divided transporting space AA2. The suction unit 37A2 is installed in a lower part of the divided transporting space AA2. The suction unit 37A2 is opposed to the blowout unit 33A2 across the main transport mechanism TA2. The suction unit 33A2 has openings (suction bores) formed in an upper surface thereof for sucking the gas. Preferably, the sucking unit 37A2 in plan view has substantially the same expanse as the divided transporting space AA2.

The gas exhaust device 36A has an exhaust fan 38A. The exhaust fan 38A is connected to the suction units 37A1 and 37A2 through an exhaust pipe 39A. The exhaust fan 38A is installed outside the transporting space AA (e.g. in a lower part of the treating block BA). The exhaust fan 38A has a secondary side thereof open to the exterior of the substrate treating apparatus 1. The exhaust fan 38A discharges the gas from the transporting space AA outside the substrate treating apparatus 1.

The gas exhaust device 36B has the same construction as the gas exhaust device 36A. The gas exhaust device 36B has suction units 37B1 and 37B2 and exhaust fan 38B. The suction units 37B1 and 37B2 correspond to the suction units 37A1 and 37A2, respectively. The exhaust fan 38B corresponds to the exhaust fan 38A.

<Detailed Construction of Solution Treating Units SU, and Construction Relating to Gas Supply to and Gas Exhaust from Solution Treating Units SU>

Figure 7:
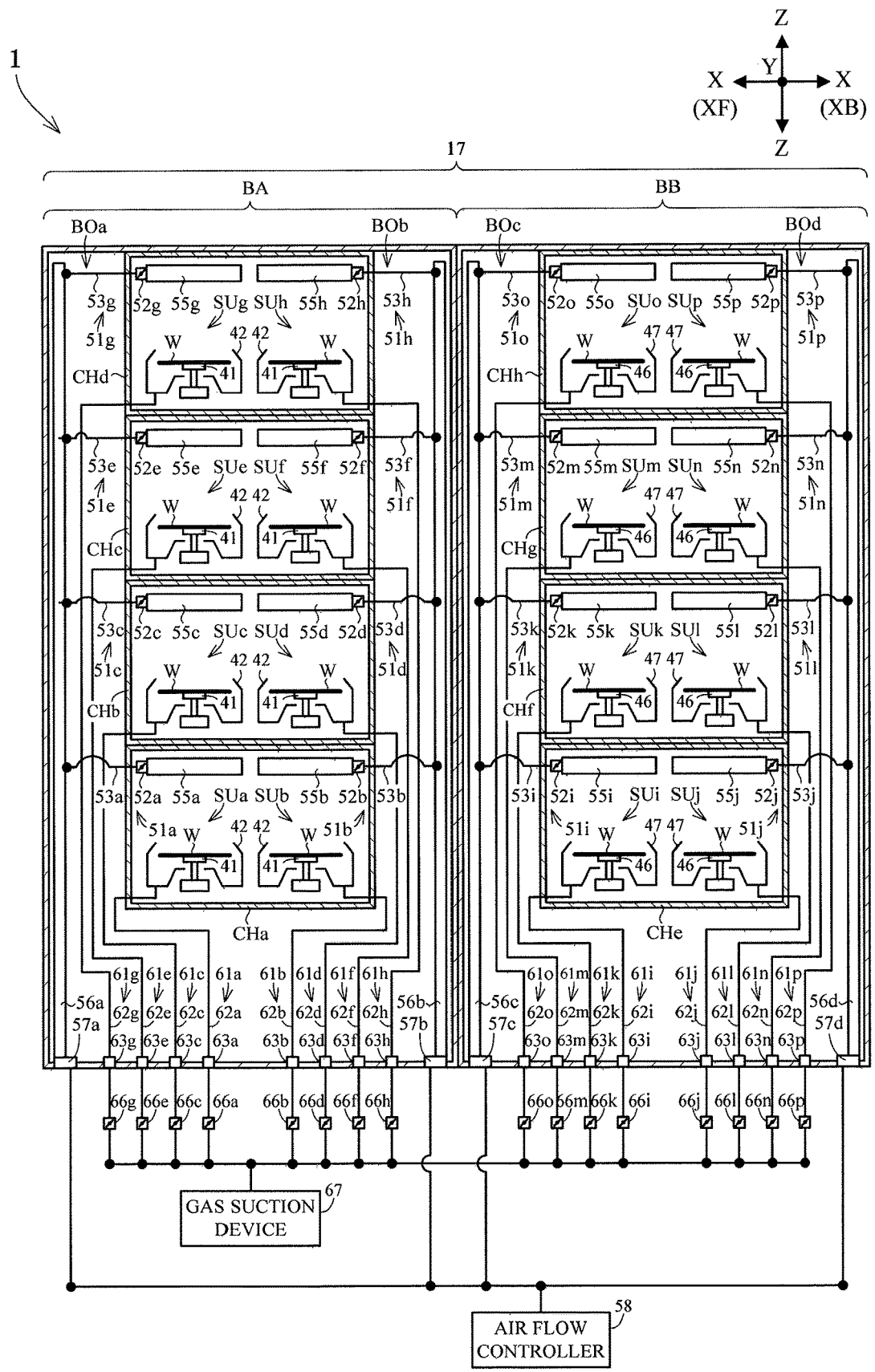
FIG. 7 is a detailed side view showing solution treating units, individual gas supply devices and individual gas exhaust devices.

A construction of the solution treating units SU will be described. Reference is made to FIGS. 1 and 7. FIG. 7 is a detailed side view of the side having the solution treating units SU of the treating section 17.

Each of the solution treating units SUa-SUh has a spin holder 41, a cup 42, nozzle 43 and a nozzle transport mechanism 44. The nozzle 43 and nozzle transport mechanism 44 are shown in FIG. 1. The spin holder 41 rotatably holds a wafer W. The cup 42 is disposed around the spin holder 41. When each solution treating unit SU treats the wafer W, the cup 42 surrounds side areas of the wafer W held by the spin holder 41. Consequently, the cup 42 collects the treating solution scattering from the wafer W. A plurality of (e.g. two) cups 42 arranged in the same chamber CH adjoin each other substantially in the horizontal direction. A plurality of nozzles 43 are movable between standby positions laterally of the cups 42 and treating positions above the wafers W. Each nozzle 43 discharges a treating solution. More particularly, the nozzles 43 of the antireflection film coating units BARC discharge the antireflection film material. The nozzles 43 of the resist film coating units RESIST discharge the resist film material. Each nozzle transport mechanism 44 holds one nozzle 43 and moves the nozzle 43 between the standby position and treating position.

The cups 42 of the solution treating units SUa, SUc, SUe and SUg are arranged in one column extending substantially in the up-down direction Z. The cups 42 of the solution treating units SUa, SUc, SUe and SUg constitute a columnar group of cups 42 (hereinafter called simply "cup group"). The cups 42 of the solution treating units SUb, SUd, SUf and SUh are arranged in one column extending substantially in the up-down direction Z. The cups 42 of the solution treating units SUb, SUd, SUf and SUh constitute one cup group.

Each of the solution treating units SUi-SUp has a spin holder 46, a cup 47, a nozzle 48 and a nozzle transport mechanism 49. The nozzle 48 and nozzle transport mechanism 49 are shown in FIG. 1. The spin holder 46 rotatably holds a wafer W. The cup 47 is disposed around the spin holder 46. When each of the solution treating units SUi-SUp treats the wafer W, the cup 47 surrounds side areas of the wafer W held by the spin holder 46. A plurality of cups 47 arranged in the same chamber CH adjoin each other substantially in the horizontal direction. Each nozzle 48 discharges the developer. The nozzle 48 is a slit nozzle, for example. Each nozzle transport mechanism 49 moves a nozzle 48.

The cups 47 of the solution treating units SUi, SUk, SUm and SUo are arranged in one column extending substantially in the up-down direction Z. The cups 47 of the solution treating units SUi, SUk, SUm and SUo constitute one cup group. The cups 47 of the solution treating units SUj, SUl, SUn and SUp are arranged in one column extending substantially in the up-down direction Z. The cups 47 of the solution treating units SUj, SUl, SUn and SUp constitute one cup group.

Figure 8:
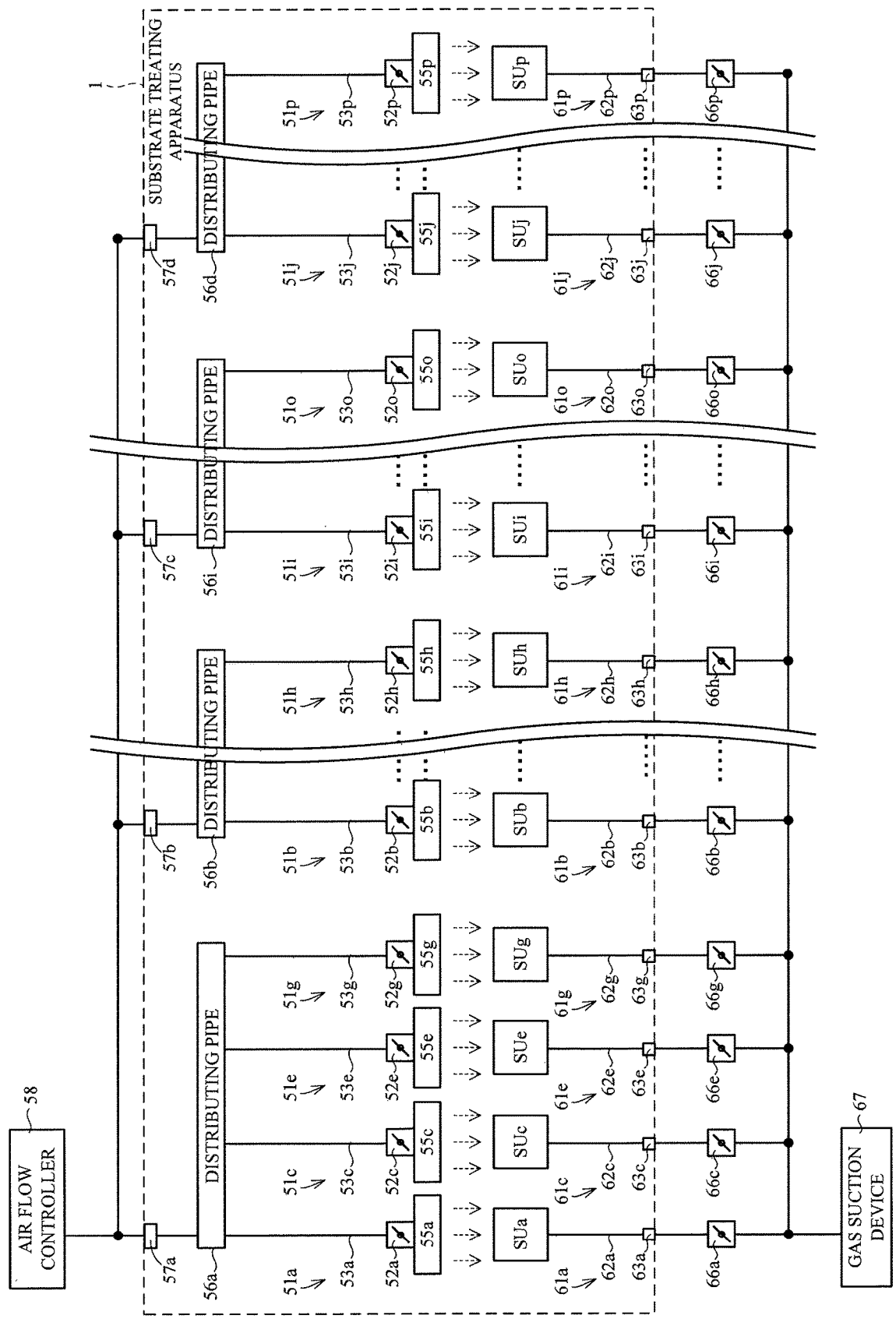
FIG. 8 is a distribution diagram of gas supply to and gas exhaust from the solution treating units.

A construction relating to gas supply to the solution treating units SU will be described with reference to FIGS. 7 and 8. FIG. 8 is a distribution diagram of gas supply to and gas exhaust from the solution treating units.

The substrate treating apparatus 1 has a plurality of individual gas supply devices 51a, 51b, . . . , 51p. The individual gas supply devices 51a-51p are provided individually for the respective solution treating units SUa-SUp. Each of the individual gas supply devices 51a-51p is related to one of the solution treating units SUa-SUp. For example, the individual gas supply device 51a corresponds to the solution treating unit SUa. The individual gas supply devices 51a-51p are equal in number to the solution treating units SUa-SUp. In the following description, the individual gas supply devices 51a, 51b, . . . , 51p, when not particularly distinguished, will be written simply "individual gas supply device(s) 51".

Each individual gas supply device 51 supplies gas only to one corresponding solution treating unit SU. For example, the individual gas supply device 51a supplies gas only to the solution treating unit SUa corresponding to the individual gas supply device 51a. The individual gas supply device 51a does not supply gas to the solution treating units SUb-SUp other than the solution treating unit SUa. Each gas supply device 51 has an adjustable rate of gas supply to the solution treating unit SU. For example, the individual gas supply device 51a supplies gas at a variable supply rate only to the solution treating unit SUa.

The substrate treating apparatus 1 has a plurality of blowout units 55a, 55b, 55p. The blowout units 55a-55p are individually connected to the individual gas supply devices 51a-51p. For example, the blowout unit 55a is connected only to the individual gas supply device 51a. Each of the blowout units 55a-55p blows out gas only to one solution treating unit SU. For example, the blowout unit 55a blows out gas only to the solution treating unit SUa. The blowout units 55a-55p are installed above the solution treating units SUa, SUb, SUp, respectively. The blowout units 55a-55p, when not particularly distinguished, will be written simply "blowout unit(s) 55".

The blowout units 55 are installed in the chambers CH. For example, the blowout units 55a and 55b are installed in the chamber CHa. The plurality of blowout units 55 installed in the same chamber CH adjoin each other substantially in the horizontal direction. For example, the blowout units 55a and 55b adjoin each other substantially in the horizontal direction.

The blowout units 55a, 55c, 55e and 55g are arranged in one column extending substantially in the up-down direction Z. The blowout units 55a, 55c, 55e and 55g constitute a columnar group of blowout units 55 (hereinafter called simply "blowout unit group"). The blowout units 55b, 55d, 55f and 55h are arranged in one column extending substantially in the up-down direction Z. The blowout units 55b, 55d, 55f and 55h constitute one blowout unit group. The blowout units 55i, 55k, 55m and 55o are arranged in one column extending substantially in the up-down direction Z. The blowout units 55i, 55k, 55m and 55o constitute one blowout unit group. The blowout units 55j, 55l, 55n and 55p are arranged in one column extending substantially in the up-down direction Z. The blowout units 55j, 55l, 55n and 55p constitute one blowout unit group.

Each blowout unit group corresponds to one of the solution treating unit groups. For example, the blowout unit group formed of the blowout units 55a, 55c, 55e and 55g corresponds to the solution treating unit group formed of the solution treating units SUa, SUc, SUe and SUg. The blowout units 55a, 55c, 55e and 55g blow out gas to the solution treating units SUa, SUc, SUe and SUg, respectively.

Each blowout unit 55 is in the shape of a flat box. Each blowout unit 55 has openings formed in a lower surface thereof for blowing out the gas. Preferably, the blowout unit 55 in plan view has an expanse for covering an area above each of the cups 42/47. In FIG. 1, the blowout units 55g, 55h, 55o and 55p are indicated in dotted lines.

The individual gas supply devices 51a, 51b, . . . , 51p have supply dampers 52a, 52b, . . . , 52p, respectively. The supply dampers 52a-52p adjust the rate of gas supply to the solution treating units SU, respectively. For example, the supply damper 52a adjusts the rate of gas supply to the solution treating unit SUa. The supply damper 52b adjusts the rate of gas supply to the solution treating unit SUb. Each of the supply dampers 52a-52p includes a blade for opening and closing a gas flow path, and an air cylinder for driving the blade, for example. Operations of the air supply dampers 52a-52p are independent of each other.

The supply dampers 52a-52p, when not particularly distinguished, will be written "supply damper(s) 52".

Each supply damper 52 is directly connected to the blowout unit 55. For example, the supply damper 52a is connected to the front of the blowout unit 55a. The supply damper 52b is connected to the rear of the blowout unit 55b.

The supply dampers 52 are installed in the chambers CH. For example, the supply dampers 52a and 52b are installed in the chamber CHa.

The supply dampers 52 are an example of the gas supply adjuster in this invention.

The individual gas supply devices 51a, 51b, . . . , 51p have supply pipes 53a, 53b, . . . , 53p, respectively. The supply pipes 53a-53p transmit the gas. The supply pipes 53a-53p, when not particularly distinguished, will be written simply "supply pipe(s) 53".

One end of the gas supply pipe 53 is directly connected to the supply damper 52. Consequently, the supply pipe 53 is indirectly connected to the blowout unit 55 through the supply damper 52. For example, the supply pipe 53a is connected to the blowout unit 55a through the supply damper 52a. The supply pipe 53b is connected to the blowout unit 55b through the supply damper 52b.

The plurality of supply pipes 53 connected respectively to the plurality of blowout units 55 adjoining each other substantially in the horizontal direction extend in different directions from the blowout units 55. For example, the blowout units 55a and 55b adjoin each other substantially in the horizontal direction. The supply pipe 53a is connected to the blowout unit 55a. The supply pipe 53b is connected to the blowout unit 55b. The supply pipe 53a extends forward XF from the blowout unit 55a. The supply pipe 53b extends backward XB from the blowout unit 55b. Thus, the direction in which the supply pipe 53a extends from the blowout unit 55a is different from the direction in which the supply pipe 53b extends from the blowout unit 55b. Specifically, the direction in which the supply pipe 53a extends from the blowout unit 55a is opposite to the direction in which the supply pipe 53b extends from the blowout unit 55b.

A part including one end of the supply pipe 53 is located inside the chamber CH. For example, such part of each of the supply pipes 53a and 53b is located inside the chamber CHa.

The supply pipe 53 penetrates the chamber CH. The other part (hereinafter called the "other end portion(s)") of the supply pipe 53 is located outside the chamber CH. The other end portion of the supply pipe 53 includes the other end of the gas supply pipe 53. A fluid box section BOa is provided forward XF of the chambers CHa-CHd. The other end portions of the supply pipes 53a, 53c, 53e and 53g are located in the fluid box section BOa. A fluid box section BOb is provided backward XB of the chambers CHa-CHd. The other end portions of the supply pipes 53b, 53d, 53f and 53h are located in the fluid box section BOb. A fluid box section BOc is provided forward XF of the chambers CHe-CHh. The other end portions of the supply pipes 53i, 53k, 53m and 53o are located in the fluid box section BOc. A fluid box section BOd is provided backward XB of the chambers CHe-CHh. The other end portions of the supply pipes 53j, 53l, 53n and 53p are located in the fluid box section BOd.

The substrate treating apparatus 1 has distributing pipes 56a, 56b, 56c and 56d. The distributing pipes 56a, 56b, 56c and 56d are provided individually for the solution treating unit groups. Specifically, the distributing pipe 56a is related to one solution treating unit group consisting of the solution treating units SUa, SUc, SUe and SUg. The distributing pipe 56b is related to one solution treating unit group consisting of the solution treating units SUb, SUd, SUf and SUh. The distributing pipe 56c is related to one solution treating unit group consisting of the solution treating units SUi, SUk, SUm and SUo. The distributing pipe 56d is related to one solution treating unit group consisting of the solution treating units SUj, SUl, SUn and SUp.

As a result, the distributing pipe 56a is related to the solution treating units SUa, SUc, SUe and SUg. Further, the distributing pipe 56a is related to the individual gas supply devices 51a, 51c, 51e and 51g which supply gas to the solution treating units SUa, SUc, SUe and SUg. The distributing pipe 56a is related to the blowout units 55a, 55c, 55e and 55g which blow out gas to the solution treating units SUa, SUc, SUe and SUg. The same applies also to the other distributing pipes 56b-56d.

The distributing pipes 56a, 56b, 56c and 56d distribute the gas only to the plurality of individual gas supply devices 51 corresponding to the solution treating unit groups, respectively. For example, the distributing pipe 56a distributes the gas only to the individual gas supply devices 51a, 51c, 51e and 51g. The distributing pipe 56a does not distribute the gas to the individual gas supply devices 51 other than the individual gas supply devices 51a, 51c, 51e and 51g. Similarly, the distributing pipe 56b distributes the gas only to the individual gas supply devices 51b, 51d, 51f and 51h. The distributing pipe 56c distributes the gas only to the individual gas supply devices 51i, 51k, 51m and 51o. The distributing pipe 56d distributes the gas only to the individual gas supply devices 51j, 51l, 51n and 51p.

The distributing pipe 56a is installed in the fluid box section BOa. The distributing pipe 56a is connected to the supply pipes 53a, 53c, 53e and 53g. More particularly, the distributing pipe 56a is connected to the other ends of the supply pipes 53a, 53c, 53e and 53g. However, the distributing pipe 56a is not connected to the supply pipes 53 other than the supply pipes 53a, 53c, 53e and 53g. Similarly, the distributing pipe 56b is installed in the fluid box section BOb. The distributing pipe 56b is connected to the supply pipes 53b, 53d, 53f and 53h. The distributing pipe 56c is installed in the fluid box section BOc. The distributing pipe 56c is connected to the supply pipes 53i, 53k, 53m and 53o. The distributing pipe 56d is installed in the fluid box section BOd. The distributing pipe 56d is connected to the supply pipes 53j, 53l, 53n and 53p.

The distributing pipes 56a-56d, when not particularly distinguished, will be written simply "distributing pipe(s) 56".

The distributing pipes 56 are installed to extend in the up-down direction Z in positions laterally of the solution treating unit groups corresponding to the distributing pipes 56. For example, the distributing pipe 56a is installed to extend in the up-down direction Z, in a position laterally (e.g. forward XF) of the solution treating units SUa, SUc, SUe and SUg. The distributing pipe 56b is installed to extend in the up-down direction Z in a position laterally (e.g. backward XB) of the solution treating units SUb, SUd, SUf and SUh.

The distributing pipe 56 has a range in the up-down direction Z that preferably includes height positions of all the solution treating units SU belonging to the corresponding solution treating unit group. It is preferred, for example, that the range in the up-down direction Z of the distributing pipe 56a covers height positions of the solution treating units SUa, SUc, SUe and SUg.

The distributing pipe 56 is installed to extend in the up-down direction Z, laterally of the blowout unit group corresponding to the distributing pipe 56. For example, the distributing pipe 56a is installed to extend in the up-down direction Z, in a position laterally (e.g. forward XF) of the blowout units 55a 55c, 55e and 55g. The distributing pipe 56b is installed to extend in the up-down direction Z, in a position laterally (e.g. backward XB) of the blowout units 55b, 55d, 55f and 55h.

The distributing pipe 56 has a range in the up-down direction Z that preferably includes height positions of all the blowout units 55 belonging to the corresponding blowout unit group. It is preferred, for example, that the range in the up-down direction Z of the distributing pipe 56a covers height positions of the blowout units 55a 55c, 55e and 55g.

The substrate treating apparatus 1 further includes supply ports 57a, 57b, 57c and 57d for the distributing pipes. The supply ports 57a-57d are provided individually for the distributing pipes 56a-56d. The supply port 57a is connected to the distributing pipe 56a. The supply port 57b is connected to the distributing pipe 56b. The supply port 57c is connected to the distributing pipe 56c. The supply port 57d is connected to the distributing pipe 56d. The supply ports 57a-57d are connectable to external equipment installed outside the substrate treating apparatus 1, respectively. The supply ports 57a-57d are arranged in a bottom surface of the treating section 17, for example.

In this embodiment, the supply ports 57a-57d are connected to an air flow controller 58. The air flow controller 58 is external equipment of the substrate treating apparatus 1. The air flow controller 58 is installed outside the substrate treating apparatus 1. The air flow controller 58 supplies gas (e.g. clean air) at an adjusted temperature and humidity. The air flow controller 58 is an example of external equipment (more strictly, gas supplying external equipment) in this invention.

A construction regarding gas exhaust from the solution treating units SU will be described with reference to FIGS. 7 and 8.

The substrate treating apparatus 1 has a plurality of individual gas exhaust devices 61a, 61b, . . . , 61p. The individual gas exhaust devices 61a-61p are provided individually for the respective solution treating units SUa-SUp. Each of the individual gas exhaust devices 61a-61p is related to one of the solution treating units SUa-SUp. For example, the individual gas exhaust device 61a corresponds to the solution treating unit SUa. The individual gas exhaust devices 61a-61p are equal in number to the solution treating units SUa-SUp. In the following description, the individual gas exhaust devices 61a, 61b, . . . , 61p, when not particularly distinguished, will be written simply "individual gas exhaust device(s) 61".

Each individual gas exhaust device 61 exhausts gas only from one corresponding solution treating unit SU. For example, the individual gas exhaust device 61a exhausts gas only from the solution treating unit SUa corresponding to the individual gas exhaust device 61a. The individual gas exhaust device 61a does not exhaust gas from the solution treating units SUb-SUp other than the solution treating unit SUa. Each gas exhaust device 61 has an adjustable rate of gas exhaust from the solution treating unit SU. For example, the individual gas exhaust device 61a exhausts gas at a variable exhaust rate only from the solution treating unit SUa.

The individual gas exhaust devices 61a, 61b, . . . , 61p have exhaust pipes 62a, 62b, 62p, respectively. The exhaust pipes 62a-62p transmit the gas. The exhaust pipes 62a-62p, when not particularly distinguished, will be written simply "exhaust pipe(s) 62".

The exhaust pipes 62a-62h are connected to the cups 42 of the solution treating units SUa-SUh, respectively. For example, one end of the exhaust pipe 62a is directly connected to the cup 42 of the solution treating unit SUa. Consequently, the exhaust pipe 62a exhausts the gas in the cup 42 of the solution treating unit SUa. Similarly, the exhaust pipes 62i-62p are connected to the cups 47 of the solution treating units SUi-SUp, respectively.

The plurality of exhaust pipes 62 connected respectively to the plurality of cups 42/47 adjoining each other substantially in the horizontal direction extend in different directions from the cups 42/47. For example, the cup 42 of the solution treating unit SUa and the cup 42 of the solution treating unit SUb adjoin each other substantially in the horizontal direction. The exhaust pipe 62a is connected to the cup 42 of the solution treating unit SUa. The exhaust pipe 62b is connected to the cup 42 of the solution treating unit SUb. The exhaust pipe 62a extends forward XF from the cup 42 of the solution treating unit SUa. The exhaust pipe 62b extends backward XB from the cup 42 of the solution treating unit SUb. Thus, the direction in which the exhaust pipe 62a extends from the cup 42 of the solution treating unit SUa is different from the direction in which the exhaust pipe 62b extends from the cup 42 of the solution treating unit SUb. Specifically, the direction in which the exhaust pipe 62a extends from the cup 42 of the solution treating unit SUa is opposite to the direction in which the exhaust pipe 62b extends from the cup 42 of the solution treating unit SUb.

A part including one end of the exhaust pipe 62 is located inside the chamber CH. For example, such parts of the exhaust pipes 62a and 62b are located inside the chamber CHa.

The exhaust pipe 62 penetrates the chamber CH. The other portion (hereinafter called "the other end portion(s)") of the exhaust pipe 62 is located outside the chamber CH. The other end portion of the exhaust pipe 62 includes the other end of the exhaust pipe 62. For example, the other end portions of the exhaust pipes 62a, 62c, 62e and 62g are located in the fluid box section BOa. The exhaust pipes 62 bend inside the fluid box sections BOa-BOd and extend downward.

The individual gas exhaust devices 61a, 61b, . . . , 61p have exhaust ports 63a, 63b, 63p, respectively. The exhaust ports 63a-63p are connected to the exhaust pipes 62a-62p, respectively. For example, the exhaust port 63a is directly connected to the other end of the exhaust pipe 62a. The exhaust ports 63a-63p are connectable to external equipment installed outside the substrate treating apparatus 1. The exhaust ports 63a-63p are arranged in the bottom surface of the treating section 17, for example. The exhaust ports 63a-63p, when not particularly distinguished, will be written simply "exhaust port(s) 63."

As described above, the individual gas exhaust devices 61a-61p are separated from one another at least inside the substrate treating apparatus 1. In other words, the individual gas exhaust devices 61a-61p are not connected directly or indirectly to one another at least inside the substrate treating apparatus 1. Therefore, the gas flow path of each of the individual gas exhaust devices 61a-61p is maintained separate from that of the other at least inside the substrate treating apparatus 1.

The exhaust ports 63a-63p are connected to exhaust dampers 66a-66p, respectively. The exhaust dampers 66a-66p are external equipment of the substrate treating apparatus 1. The exhaust dampers 66a-66p are installed outside the substrate treating apparatus 1. For example, the exhaust port 63a is connected to the exhaust damper 66a. The exhaust dampers 66a-66p adjust the rate of gas exhaust from the solution treating units SUa-SUp, respectively. For example, the exhaust damper 66a adjusts the rate of gas exhaust from the solution treating unit SUa. The exhaust dampers 66a-66p are connected to a gas suction device 67. The gas suction device 67 is external equipment of the substrate treating apparatus 1. The gas suction device 67 is installed outside the substrate treating apparatus 1. The gas suction device 67 is a vacuum pump, exhaust blower or ejector, for example. The exhaust dampers 66a-66p and gas suction device 67 are each an example of external equipment (more strictly, gas exhausting external equipment) in this invention.

<Interface Section 19>

Reference is made to FIG. 1. The interface section 19 has interface's transport mechanisms TIF. In this embodiment, the interface's transport mechanisms TIF include two transport mechanisms TIFa and TIFb. The transport mechanisms TIFa and TIFb transport wafers W, respectively.

Reference is made to FIG. 2. The interface section 19 has receivers PA-CP and PAgR and buffers BF. The receivers PA-CP and PAgR and buffers BF are installed between the transport mechanism TIFa and transport mechanism TIFb. The receiver PA-CP receives a wafer W and cools the wafer W. The receiver PAgR only receives a wafer W. The buffers BF can receive a plurality of wafers W.

Both the transport mechanisms TIFa and TIFb access the receivers PA-CP and PAgR and buffers BF. The transport mechanisms TIFa and TIFb transport wafers W reciprocally through the receivers PA-CP and PAgR.

The transport mechanism TIFa can further access the receivers PAeS, PAeR, PAfS and PAfR and heat-treating units PEBc and PEBd of the treating block BB. The transport mechanism TIFa and main transport mechanism TB1 reciprocally transfer wafers W using the receivers PAeS and PAeR. The transport mechanism TIFa and main transport mechanism TB2 reciprocally transfer wafers W using the receivers PAfS and PAfR. The transport mechanism TIFa transports wafers W to the heat-treating units PEBc and PEBd of the treating block BB.

The transport mechanism TIFb further transports wafers W to the exposing machine EXP.

Each of the transport mechanisms TIFa and TIFb has two hands 71 for holding wafers W, and hand drive mechanisms 72 for driving the respective hands 71. Each hand 71 holds one wafer W. The hand drive mechanism 72 moves the hand 71 in the fore-and-aft direction X, width direction Y and up-down direction Z, and rotates the hand 72 about the up-down direction Z. Consequently, each hand 71 accesses various receivers and the like.

<Construction of Control System>

Figure 9:
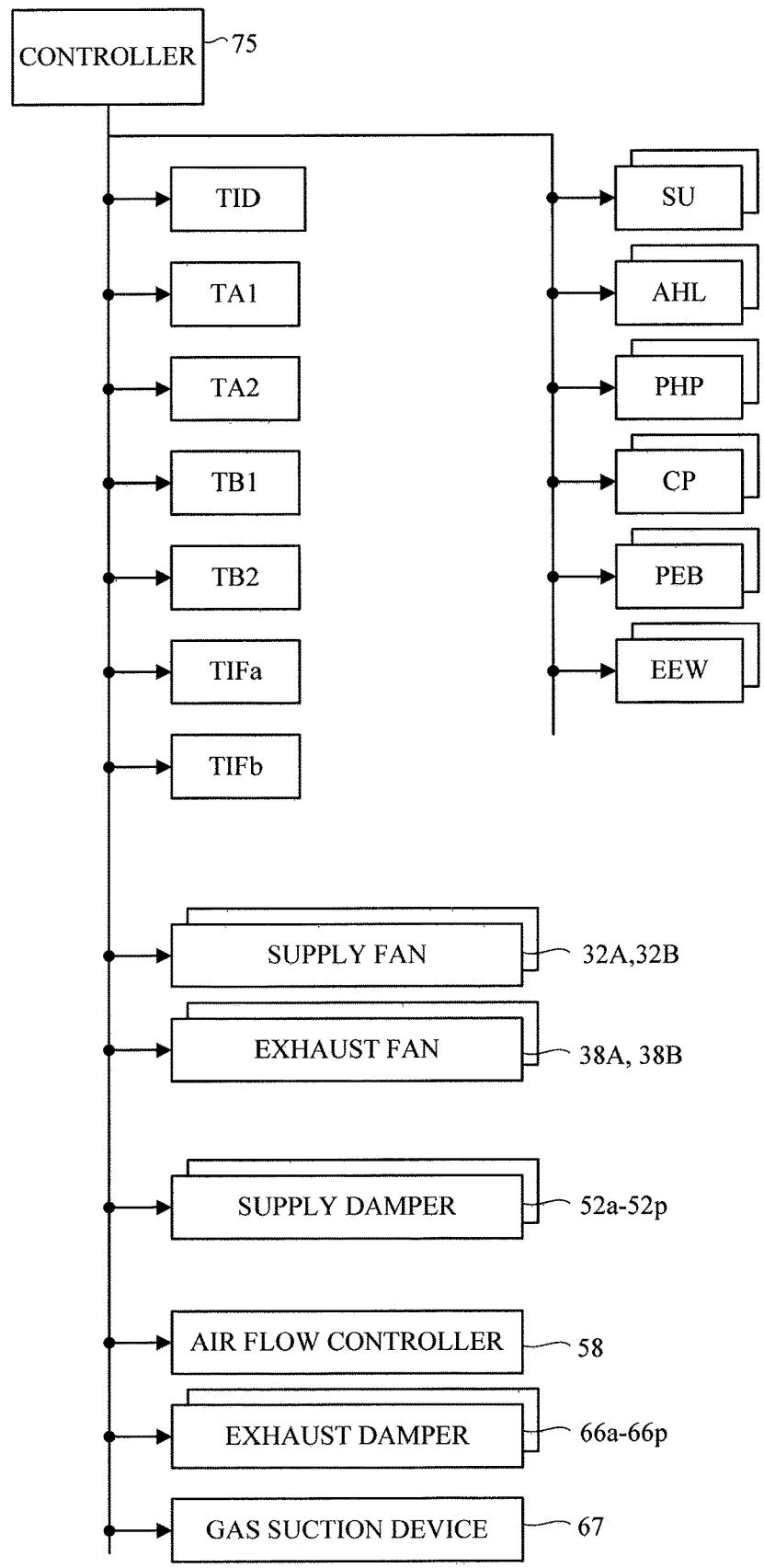
FIG. 9 is a control block diagram of the substrate treating apparatus.

Reference is made to FIG. 9. FIG. 9 is a control block diagram of the substrate treating apparatus 1. The substrate treating apparatus 1 further includes a controller 75.

The controller 75 is installed in the indexer section 11, for example. The controller 75 performs overall control of the substrate treating apparatus 1. Specifically, the controller 75 controls the transport mechanisms TID, TA1, TA2, TB1, TB2, TIFa and TIFb, solution treating units SU, heat-treating units AHL, PHP, CP and PEB, edge exposing units EEW, supply fans 32A and 32B, exhaust fans 38A and 38B, and supply dampers 52a-52p. Further, the controller 75 may control the external equipment. For example, the controller 75 may control the air flow controller 58, exhaust dampers 66a-66p and gas suction device 67.

The controller 75 is realized by a central processing unit (CPU) which performs various processes, a RAM (Random-Access Memory) which provides working space for arithmetic processing, and a storage medium such as a fixed disk. The storage medium stores various information such as treatment recipes (processing programs) for treating wafers W and information for identifying each wafer W.

Examples of Operation

Next, examples of operation of the substrate treating apparatus according to the embodiment will be described.

Figure 10:
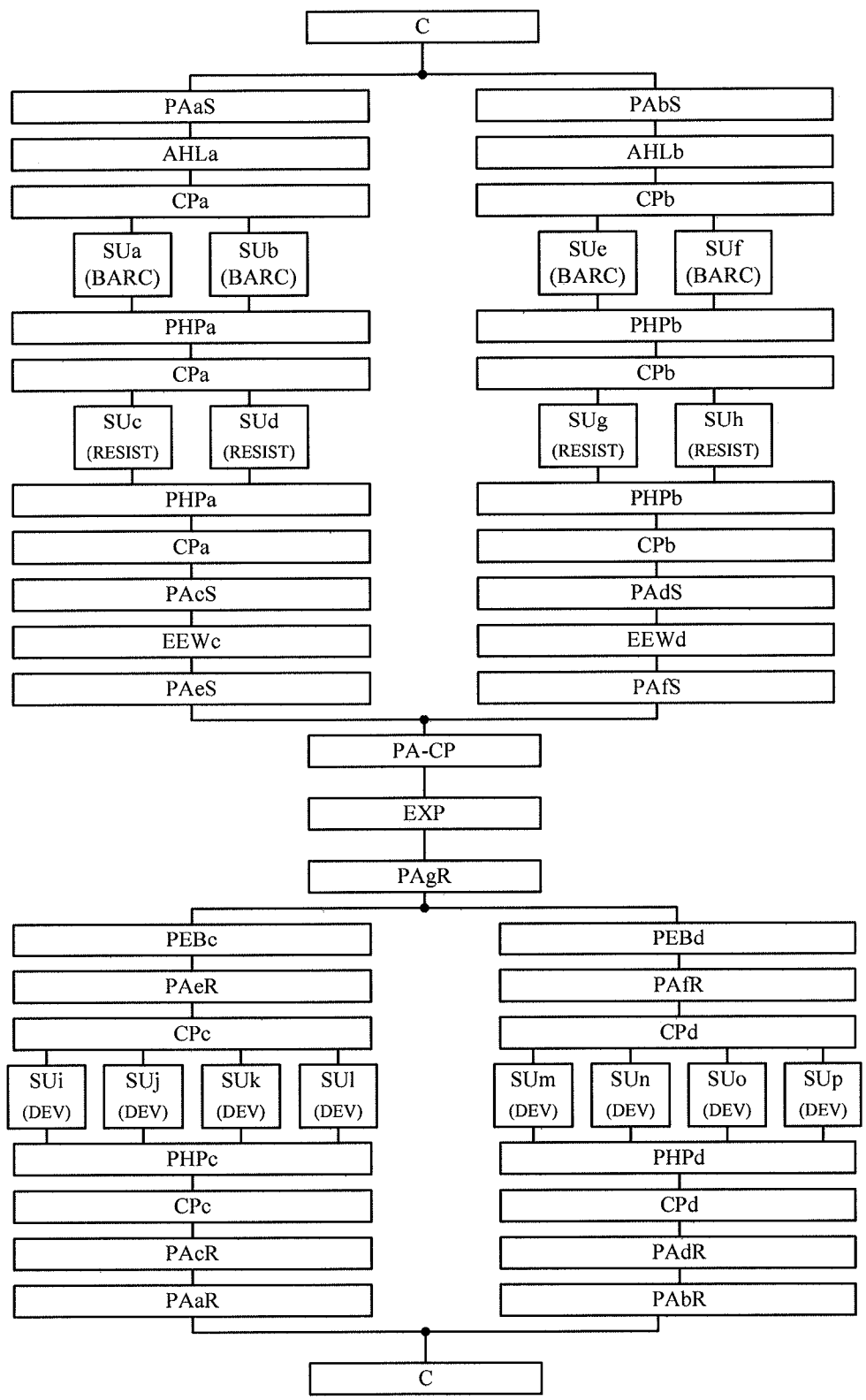
FIG. 10 is a view illustrating substrate transport routes.

Here, examples of operation of the substrate treating apparatus will be described as divided into three operations:

1. Operation relating to transportation of wafers W and treatment of wafers W
2. Operation relating to gas supply to and gas exhaust from transporting spaces AA and AB
3. Operation relating gas supply to and gas exhaust from solution treating units SU 1. Operation Relating to Transportation of Wafers W and Treatment of Wafers W FIG. 10 is a view illustrating transport routes of wafers W. In FIG. 10, the wafers W are transported from top to bottom. Each wafer W moves forward and backward between the carrier C (indexer section 11) and the exposing machine EXP. The section from the carrier C (indexer section 11) to the exposing machine EXP is called "outgoing course". The section from the exposing machine EXP to the carrier C (indexer section 11) is called "incoming course". Operation relating to the transportation and treatment of the wafers will be described hereinafter as divided into the outgoing course and the incoming course.

For expediency, the solution treating units SUa, SUb, SUe and SUf will be called "antireflection film coating units SUa, SUb, SUe and SUf". The solution treating units SUc, SUd, SUg and SUh will be called "resist film coating units SUc, SUd, SUg and SUh". The solution treating units SUi-SUp will be called "developing units SUi-SUp". The heat-treating units AHL, CP, PHP and PEB will be called "hydrophobizing units AHL", "cooling units CP", "heating and cooling units PHP" and "post-exposure heat-treating units PEB", respectively.

1-1. Outgoing Course

In the indexer section 11, the indexer's transport mechanism TID transports wafers W from a carrier C alternately to the receiver PAaS and receiver PAbS. For example, the indexer's transport mechanism TID repeats alternately operation to transport one wafer W from a carrier C to the receiver PAaS, and operation to transport one wafer W from the carrier C to the receiver PAbS.

On the story Ka, the main transport mechanism TA1 receives the wafer W on the receiver PAaS, and transports the wafer W to the respective treating units in a predetermined order. The predetermined order is as follows, for example (see FIG. 10):

Example of predetermined order: hydrophobizing unit AHLa→cooling unit CPa→antireflection film coating unit SUa/SUb→heating and cooling unit PHPa→cooling unit CPa→resist film coating unit SUc/SUd→heating and cooling unit PHPa→cooling unit CPa Each treating unit performs treatment of to the wafer W. For example, the hydrophobizing unit AHL performs hydrophobizing treatment. The cooling unit CP performs cooling treatment. The antireflection film coating unit SUa/SUb performs antireflection film forming treatment. The resist film coating unit SUc/SUd performs resist film forming treatment. Through the series of these treatments, antireflection film and resist film are formed on the wafer W. The main transport mechanism TA1 transports the wafer W having undergone the series of treatments to the receiver PAcS.

An example of operation of the solution treating units SUa-SUd will be described in detail. The main transport mechanism TA1 places the wafer W on the spin holder 41. The spin holder 41 holds the wafer W. The cup 42 surrounds side areas of the wafer W on the spin holder 41. The spin holder 41 spins the wafer W in a horizontal position. The nozzle transport mechanism 44 moves one nozzle 43 to the position above the wafer W. The nozzle 43 supplies the treating solution (antireflection film material/resist film material) to the wafer W. The supplied treating solution spreads all over the wafer W. The cup 42 collects the treating solution scattering around from the wafer W. In this way, the antireflection film and resist film are formed on the wafer W.

Figure 11:
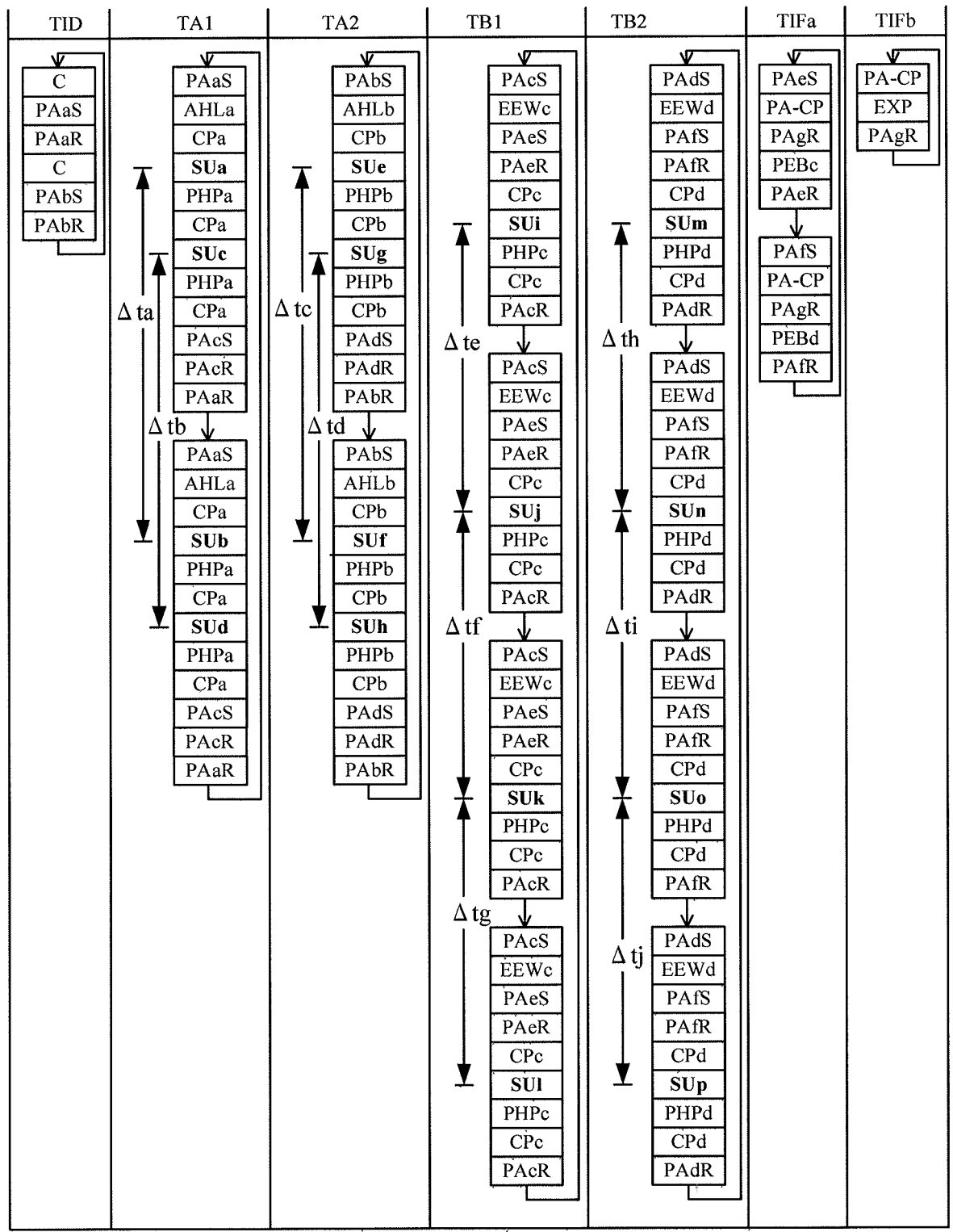
FIG. 11 is a view illustrating an order in which each transport mechanism accesses receivers and treating units.

An example of operation of the main transport mechanism TA1 will be described in detail. FIG. 11 is a view illustrating an order in which each transport mechanism accesses the receivers and treating units. The main transport mechanism TA1 accesses the receivers and treating units in the predetermined order. And the main transport mechanism TA1 replaces one wafer W in each treating unit with another.

For example, the main transport mechanism TA1 holds the wafer W received from the receiver PAaS, and accesses the hydrophobizing unit AHLa. The main transport mechanism TA1 unloads a treated wafer W from the hydrophobizing unit AHLa, and loads the wafer W received from the receiver PAaS into the hydrophobizing unit AHLa. Then, the main transport mechanism TA1 holds the wafer W unloaded from the hydrophobizing unit AHLa, and accesses the cooling unit CPa. The main transport mechanism TA1 unloads a treated wafer W from the cooling unit CPa, and puts the wafer W unloaded from the hydrophobizing unit AHLa into the cooling unit CPa. Then, the main transport mechanism TA1 holds the wafer W unloaded from the cooling unit CPa, and accesses the antireflection film coating unit SUa. The main transport mechanism TA1 replaces a treated wafer W in the antireflection film coating unit SUa with the wafer W unloaded from the cooling unit CPa. Subsequently, the main transport mechanism TA1 accesses the heating and cooling unit PHPa, cooling unit CPa, resist film coating unit SUc, heating and cooling unit PHPa, cooling unit CPa, receiver PAcS, receiver PAcR and receiver PAaR in this order. The above is a series of operations of the main transport mechanism TA1.

After the main transport mechanism TA1 carries out the series of operations, the main transport mechanism TA1 carries out a series of operations again. However, in the next series of operation, the main transport mechanism TA1 accesses the antireflection film coating unit SUb instead of the antireflection film coating unit SUa, and accesses the resist film coating unit SUd instead of the resist film coating unit SUc.

The main transport mechanism TA1 accesses the antireflection film coating units SUa and SUb alternately. Therefore, the timing of the main transport mechanism TA1 accessing the antireflection film coating unit SUa is shifted from the timing of the main transport mechanism TA1 accessing the antireflection film coating unit SUb. In other words, the timing of the main transport mechanism TA1 changing the wafers W in the antireflection film coating unit SUa is shifted from the timing of the main transport mechanism TA1 changing the wafers W in the antireflection film coating unit SUb. FIG. 11 schematically shows a lag time Δta between the antireflection film coating units SUa and SUb.

As a result, the operation of the antireflection film coating unit SUa to perform the solution treatment is shifted in time from the operation of the antireflection film coating unit SUb to perform the solution treatment. In other words, the periods when the antireflection film coating units SUa and SUb perform the solution treatment are not in agreement but are different. The operation of the antireflection film coating unit SUa to be on standby is also shifted in time from the operation of the antireflection film coating unit SUb to be on standby.

Similarly, the main transport mechanism TA1 accesses the resist film coating units SUc and SUd alternately. Therefore, a shift occurs with the timing of the main transport mechanism TA1 accessing the resist film coating units SUc and SUd. FIG. 11 schematically shows a lag time Δtb between the resist film coating units SUc and SUd.

As a result, the operations of the resist film coating units SUc and SUd are shifted in time. The operation of the antireflection film coating unit SUa is shifted in time also with respect to the operations of the resist film coating units SUc and SUd. The operation of the antireflection film coating unit SUb is also shifted in time with respect to the operations of the resist film coating units SUc and SUd.

On the story Kc, the main transport mechanism TB1 transports a wafer W from the receiver PAcS to the edge exposing unit EEWc. The edge exposing unit EEWc exposes edge portions of the wafer W. The main transport mechanism TB1 transports the wafer W with the edge portions exposed, from the edge exposing unit EEWc to the receiver PAeS.

The stories Kb and kd carry out the same operations as the stories Ka and Kc. That is, the main transport mechanism TA2 receives the wafer W from the receiver PAbS, and transports the wafer W to the respective treating units in the predetermined order. Each treating unit performs treatment of the wafer W. Consequently, antireflection film and resist film are formed on the wafer W. The main transport mechanism TA2 transports the wafer W having undergone a series of treatments to the receiver PAdS. The main transport mechanism TB2 transports a wafer W from the receiver PAdS to the edge exposing unit EEWd. The edge exposing unit EEWd exposes the edge portions of the wafer W. The main transport mechanism TB2 transports the wafer W with the edge portions exposed from the edge exposing unit EEWd to the receiver PAfS. The operations of the stories Kb and kd are carried out in parallel to the operations of the stories Ka and Kc.

Here, a shift occurs with the timing of the main transport mechanism TA2 accessing the antireflection film coating units SUe and SUf. FIG. 11 shows, by way of example, a lag time Δtc between the antireflection film coating units SUe and SUf. Similarly, a shift occurs with the timing of the main transport mechanism TA2 accessing the resist film coating units SUg and SUh. FIG. 11 shows, by way of example, a lag time Δtd between the resist film coating units SUg and SUh.

The transport mechanism TIFa transports wafers W from the receivers PAcS and PAdS to the receiver PA-CP. The transport mechanism TIFb transports the wafers W from the receiver PA-CP to the exposing machine EXP. The exposing machine EXP performs exposing treatment of the wafers W.

1-2. Incoming Course

The transport mechanism TIFb transports wafers W from the exposing machine EXP to the receiver PAgR. The transport mechanism TIFa transports the wafers W from the receiver PAgR to the post-exposure heating units PEBc and PEBd. The post-exposure heating units PEBc and PEBd perform post-exposure heating treatment of the wafers W. The transport mechanism TIFa transports the wafers W having undergone the post-exposure heating treatment from the post-exposure heating units PEBc and PEBd to the receiver PAeR and PAfR.

On the story Kc, the main transport mechanism TB1 receives the wafers W on the receiver PAeR, and transports the wafers W to the respective treating units in a predetermined order. The predetermined order is as follows, for example:

Example of the predetermined order: cooling unit CPc→developing unit SUi/SUj/SUk/SUl→heating and cooling unit PHPc→cooling unit CPc Each treating unit treats the wafers W. For example, the developing units SUi, SUj, SUk and SUl perform developing treatment. The cooling units CP perform cooling treatment. The wafers W are developed through a series of these treatments. The main transport mechanism TB1 transports the wafers W having undergone the series of treatments to the receiver PAcR.

An example of operation of the developing units SUi-SUl will be described in detail. The main transport mechanism TB1 places a wafer W on the spin holder 46. The spin holder 46 holds the wafer W. The cup 47 surrounds side areas of the wafer W on the spin holder 46. The nozzle transport mechanism 49 moves a nozzle 48 to the position above the wafer W. The nozzle 48 supplies the treating solution (developer) to the wafer W. At this time, the spin holder 46 may spin the wafer W as appropriate. The cup 47 collects the developer scattering from the wafer W. In this way, the wafer W is developed.

The main transport mechanism TB1 accesses the developing units SUi, SUj, SUk and SUl by turns. Therefore, shifts occur in the timing of the main transport mechanism TB1 accessing the developing units SUi, SUj, SUk and SUl. FIG. 11 shows, by way of example, a lag time Δte between the developing units SUi and SUj, a lag time Δtf between the developing units SUj and SUk, and a lag time Δtg between the developing units SUk and SUl. As a result, each operation of the developing units SUi, SUj, SUk and SUl is shifted in time.

On the story Ka, the main transport mechanism TA1 transports wafers W from the receiver PAcR to the receiver PAaR.

The stories Kd and kb carry out similar operations to the stories Kc and Ka. The operations of the stories Kd and kb are carried out in parallel to the operations of the stories Kc and Ka.

Here, shifts occur in the timing of the main transport mechanism TB2 accessing the developing units SUm, SUn, SUo and SUp. FIG. 11 shows, by way of example, a lag time Δth between the developing units SUm and SUn, a lag time Δti between the developing units SUn and SUo, and a lag time Δtj between the developing units SUo and SUp.

The indexer's transport mechanism TID receives the wafers W from the receivers PAaR and PAbR alternately, and transports the wafers W to a carrier C.

2. Operation Relating to Gas Supply to and Gas Exhaust from Transporting Spaces AA and AB When the operation relating to transportation of the wafers W and treatment of the wafers W is carried out, the transporting space gas supply devices 31A and 31B supply gas to the transporting spaces AA and AB, respectively, and the transporting space gas exhaust devices 36A and 36B exhaust gas from the transporting spaces AA and AB, respectively.

Specifically, the supply fan 32A draws in gas (e.g. clean air) from above the substrate treating apparatus 1, and sends the gas to the blowout units 33A1 and 33A2. The blowout units 33A1 and 33A2 blow out the gas to the divided transporting spaces AA1 and AA2, respectively. Similarly, the supply fan 32B sends gas to the blowout units 33B1 and 33B2. The blowout units 33B1 and 33B2 blow out the gas to the divided transporting spaces AB1 and AB2, respectively.

The suction units 37A1 and 37A2 suck gas from the divided transporting spaces AA1 and AA2, respectively. The exhaust fan 38A discharges the gas sucked by the suction units 37A1 and 37A2 out of the substrate treating apparatus 1. Similarly, the gas in the divided transporting spaces AB1 and AB2 is discharged by the suction units 37B1 and 37B2 and exhaust fan 38B out of the substrate treating apparatus 1.

Each operation of the transporting space gas supply device 31A and transporting space gas exhaust device 36A produces downward gas flows in the divided transporting spaces AA1 and AA2. That is, downflows are formed in the divided transporting spaces AA1 and AA2. Similarly, each operation of the transporting space gas supply device 31B and transporting space gas exhaust device 36B forms downflows in the divided transporting spaces AB1 and AB2.

3. Operation Relating to Gas Supply to and Gas Exhaust from Solution Treating Units SU When the operation relating to transportation of the wafers W and treatment of the wafers W are carried out, the individual gas supply devices 51a, 51b, ..., 51p supply gas to the solution treating units SUa-SUp, respectively, and the individual gas exhaust devices 61a-61p discharge gas from the solution treating units SUa-SUp, respectively.

Specifically, the air flow controller 58 supplies gas at the adjusted temperature and humidity to the distributing pipes 56a-56d through the supply ports 57a-57d. The distributing pipes 56a-56d distribute the gas to the individual gas supply devices 51a-51p, respectively. The gas supply devices 51a-51p supply the gas to the solution treating units SUa-SUp, respectively. Specifically, the supply pipes 53a-53p send the gas to the blowout units 55a-55p through the supply dampers 52a-52p. The supply dampers 52a-52p adjust the rate of gas supply to the solution treating units SU, respectively. Each operation of the supply dampers 52a-52p is independent of the other. The blowout units 55a-55p blow out the gas to the solution treating units SUa-SUp.

The individual gas exhaust devices 61a-61p discharge gas from the respective solution treating units SUa-SUp out of the substrate treating apparatus 1. Specifically, the exhaust pipes 62a-62p and exhaust ports 63a-63p discharge the gas in the cups 42/47 of the solution treating units SUa-SUp out of the substrate treating apparatus 1. The rates of gas exhaust from the solution treating units SUa-SUp are adjusted by the exhaust dampers 66a-66p, respectively.

Figure 12:
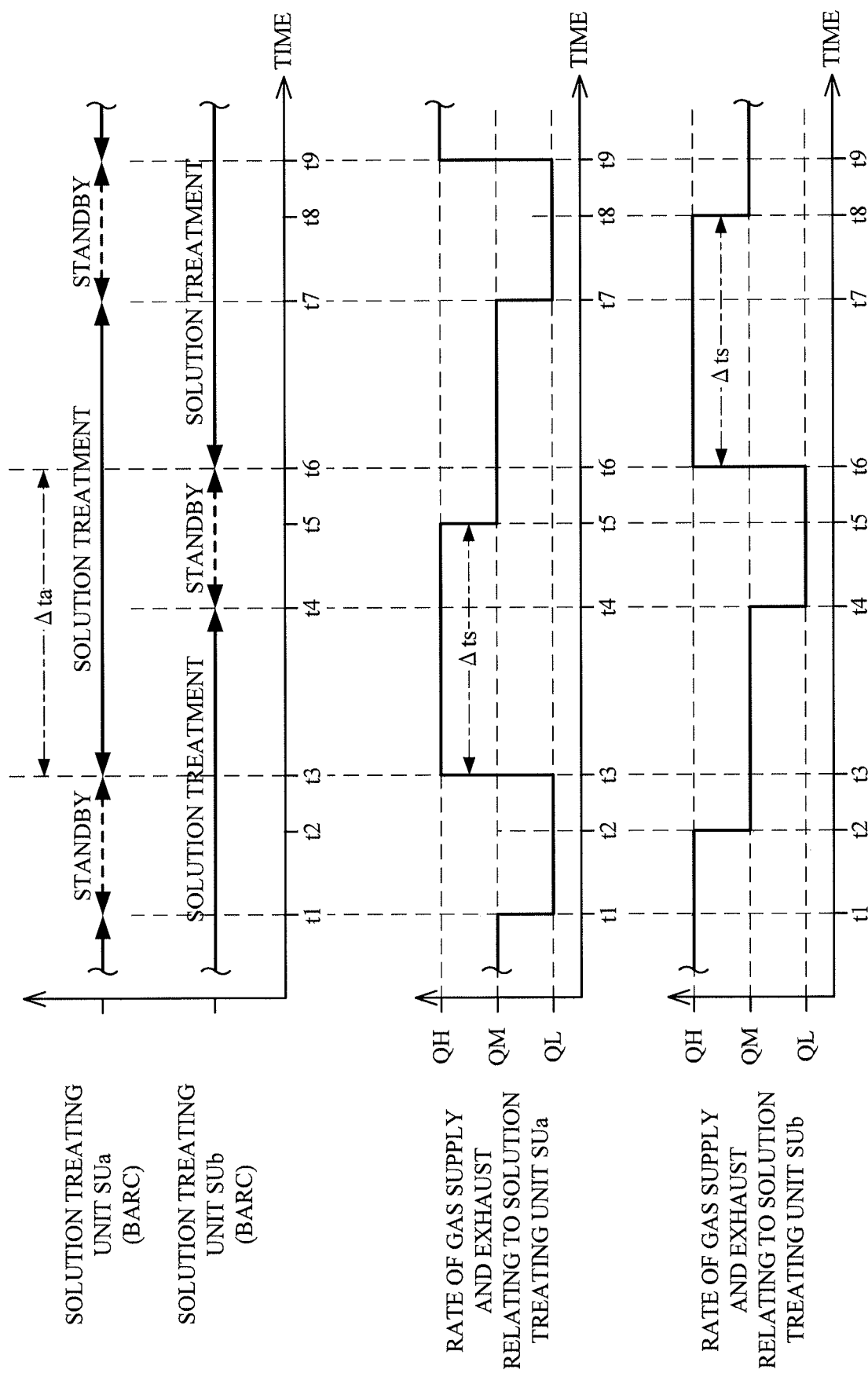
FIG. 12 is a timing chart illustrating a relationship between operation of the solution treating units, and rates of gas supply and exhaust relating to the solution treating units.

Reference is made to FIG. 12. FIG. 12 is a timing chart illustrating a relationship between operations of the solution treating units SUa and SUb, rates of gas supply and exhaust relating to the solution treating unit SUa, and rates of gas supply and exhaust relating to the solution treating unit SUb. For expediency, FIG. 12 shows, together in one graph, the rates of gas supply and exhaust relating to the solution treating unit SUa. Similarly, FIG. 12 shows, together in one graph, the rates of gas supply and exhaust relating to the solution treating unit SUb.

The solution treating unit SUa is engaged in the solution treatment of wafers W for a period of time t3-t7 and a period after time t9. The solution treating unit SUa stands by (with no solution treatment) for periods of time t1-t3 and t7-t9. While the solution treating unit SUa stands by, the wafers W are changed in the solution treating unit SUa. On the other hand, the solution treating unit SUb is engaged in the solution treatment of wafers W for a period up to time t4 and a period after time t6. The solution treating unit SUb stands by (with no solution treatment) for a period of time t4-t6. There occurs a lag time Δta between the operations of the solution treating units SUa and SUb. The lag time Δta corresponds to a period of time t3-t6, for example.

The controller 75, by controlling the supply damper 52a and exhaust damper 66a, adjusts the rate of gas supply to the solution treating unit SUa and the rate of gas exhaust from the solution treating unit SUa.

For example, when the solution treating unit SUa starts solution treatment (times t3 and t9), the rate of gas supply and the rate of gas exhaust to/from the solution treating unit SUa are increased from a low flow rate QL to a high flow rate QH. The low flow rate QL is zero or higher, for example. The high flow rate QH is higher than the low flow rate QL. Further, while the solution treating unit SUa is engaged in the solution treatment, the rate of gas supply and the rate of gas exhaust to/from the solution treating unit SUa are reduced from the high flow rate QH to a medium rate QM. For example, upon lapse of a predetermined time Δts (time t5) from when the solution treating unit SUa starts the solution treatment, the rate of gas supply and the rate of gas exhaust to/from the solution treating unit SUa are reduced from the high flow rate QH to the medium flow rate QM. The medium flow rate QM is lower than the high flow rate QH and higher than the low flow rate QL. When the solution treating unit SUa finishes the solution treatment (times t1 and t7), the rate of gas supply and the rate of gas exhaust are reduced from the medium flow rate QM to the low flow rate QL.

On the other hand, the controller 75, by controlling the supply damper 52b and exhaust damper 66b, adjusts the rate of gas supply to the solution treating unit SUb and the rate of gas exhaust from the solution treating unit SUb.

For example, the relationship between the operation of the solution treating unit SUb and the rate of gas supply and the rate of gas exhaust to/from the solution treating unit SUb is the same as the relationship between the operation of the solution treating unit SUa and the rate of gas supply and the rate of gas exhaust to/from the solution treating unit SUa. That is, when the solution treating unit SUb starts solution treatment (time t6), the rate of gas supply and the rate of gas exhaust to/from the solution treating unit SUb are increased from the low flow rate QL to the high flow rate QH. Upon lapse of the predetermined time Δts (time t8) from when the solution treating unit SUb starts the solution treatment, the rate of gas supply and the rate of gas exhaust to/from the solution treating unit SUb are reduced from the high flow rate QH to the medium flow rate QM. When the solution treating unit SUb finishes the solution treatment (time t4), the rate of gas supply and the rate of gas exhaust are reduced from the medium flow rate QM to the low flow rate QL.

<Effects>

According to this embodiment, as described above, the individual gas supply devices 51 allow the rates of gas supply to the solution treating units SU to be changed for each solution treating unit SU. For example, the rates of gas supply to the solution treating units SUa and SUb can be made different, or the rates of gas supply to the solution treating units SUa and SUb can be made equal. Consequently, an appropriate quantity of gas can be supplied in appropriate timing to each solution treating unit SU. Therefore, treatment quality in each solution treating unit SU can be improved conveniently.

Particularly, even where a plurality of solution treating units SU are arranged in the same chamber CH to perform the same type of solution treatment, the individual gas supply devices 51 can adjust the rate of gas supply to each solution treating unit SU. Consequently, the treatment quality of each solution treating unit SU can be improved further conveniently.

The individual gas supply devices 51 with the supply dampers 52 can conveniently adjust the rate of gas supply to the solution treating units SU.

The substrate treating apparatus 1 with the distributing pipe 56a can easily uniform the shape, size, direction and so on of the individual gas supply devices 51, among the individual gas supply devices 51a, 51c, 51e and 51g. Specifically, the shape, size, direction and so on of the supply pipes 53 may easily be unified among the gas supply pipes 53a, 53c, 53e and 53g. Further, the arrangement of the supply pipes 53 and supply dampers 52 can easily be unified among the individual gas supply devices 51a, 51c, 51e and 51g.

As a result, the rates of gas supply can be prevented conveniently from interfering with one another among the individual gas supply devices 51a, 51c, 51e and 51g. For example, the rate of gas supply from the individual gas supply device 51a may be prevented conveniently from causing variations in the rates of gas supply from the other individual gas supply devices 51c, 51e and 51g. When the rate of gas supply from the individual gas supply device 51a is changed intentionally, for example, this change can be prevented conveniently from inadvertently varying the rates of gas supply from the other individual gas supply devices 51c, 51e and 51g. This can conveniently improve the treatment quality in the solution treating units SUa, SUc, SUe and SUg relating to the distributing pipe 56a.

Similarly, the substrate treating apparatus 1 with the distributing pipes 56b, 56c and 56d can easily uniform the shape, size, direction and so on of the individual gas supply devices 51. As a result, the rates of gas supply can be prevented conveniently from interfering with one another among the individual gas supply devices 51. This can conveniently improve the treatment quality in the solution treating units SU.

The distributing pipe 56a is installed to extend in the up-down direction Z, in a position laterally of the solution treating unit group consisting of the solution treating units SUa, SUc, SUe and SUg. Therefore, the solution treating units SUa, SUc, SUe and SUg are located substantially in the same direction relative to the distributing pipe 56a. Further, the solution treating units SUa, SUc, SUe and SUg are spaced substantially the same distance from the distributing pipe 56a. Therefore, the shape, size, direction and so on of the individual gas supply devices 51 can be uniformed with increased ease among the individual gas supply devices 51a, 51c, 51e and 51g corresponding to the solution treating units SUa, SUc, SUe and SUg.

Similarly, the distributing pipes 56b, 56c and 56d are installed to extend in the up-down direction Z, in positions laterally of the corresponding solution treating unit groups, respectively. Therefore, the shape, size, direction and so on of the individual gas supply devices 51 can be uniformed with increased ease.

The range in the up-down direction Z of the distributing pipes 56 covers the height positions of all the solution treating units SU belonging to the corresponding solution treating unit groups. Therefore, the shape, size, direction and so on of the individual gas supply devices 51 can be uniformed with increased ease.

The distributing pipe 56a is installed to extend in the up-down direction Z, laterally of the blowout unit group consisting of the blowout units 55a, 55c, 55e and 55g. Therefore, the blowout units 55a, 55c, 55e, and 55g are located substantially in the same direction relative to the distributing pipe 56a. Further, the blowout units 55a, 55c, 55e, and 55g are spaced substantially the same distance from the distributing pipe 56a. Therefore, the shape, size, direction and so on of the individual gas supply devices 51 can be uniformed with increased ease among the individual gas supply devices 51a, 51c, 51e and 51g corresponding to the blowout units 55a, 55c, 55e, and 55g.

Similarly, the distributing pipes 56b, 56c and 56d are installed to extend in the up-down direction Z, in positions laterally of the corresponding blowout unit groups, respectively. Therefore, the shape, size, direction and so on of the individual gas supply devices 51 can be uniformed with increased ease.

The range in the up-down direction Z of the distributing pipes 56 covers the height positions of all the blowout units 55 belonging to the corresponding blowout unit groups. Therefore, the shape, size, direction and so on of the individual gas supply devices 51 can be uniformed with increased ease.

The same distributing pipe 56 does not distribute gas to the plurality of individual gas supply devices 51 corresponding to the solution treating units SU arranged to adjoin each other substantially in the horizontal direction. For example, the solution treating units SUa and SUb are arranged to adjoin each other substantially in the horizontal direction. The solution treating unit SUa corresponds to the individual gas supply device 51a. The solution treating unit SUb corresponds to the individual gas supply device 51b. The distributing pipe 56a distributes gas to the individual gas supply device 51a. The distributing pipe 56b distributes gas to the individual gas supply device 51b. Thus, the same distributing pipe 56 does not distribute gas to both of the individual gas supply devices 51a and 51b. The rates of gas supply to the treating units SUa and SUb can therefore be prevented conveniently from interfering with each other. This can conveniently improve the treatment quality in the solution treating units SUa and SUb. Thus, even where a plurality of solution treating units SU are arranged to adjoin each other substantially in the horizontal direction, the treatment quality of the solution treating units SU can be improved conveniently.

Since the distributing pipe 56 distribute gas to the plurality of (e.g. four) individual gas supply devices 51, the individual gas supply devices 51 can be reduced in size. Consequently, the installation space for the individual gas supply devices 51 can be reduced.

The substrate treating apparatus 1, with the plurality of blowout units 55 each of which blows out gas only to one solution treating unit SU, can conveniently supply the gas to each solution treating unit SU.

Since the individual gas supply devices 51 have the supply pipes 53, the individual gas supply devices 51 can conveniently send the gas to the solution treating units SU. Further, since the individual gas supply devices 51 have the supply pipes 53, the individual gas supply devices 51 can conveniently be connected to the blowout units 55. Consequently, the individual gas supply devices 51 can conveniently send the gas to the blowout units 55.

The plurality of supply pipes 53, which are respectively connected to the plurality of blowout units 55 adjoining each other substantially in the horizontal direction, extend in different directions from the blowout units 55. Consequently, the plurality of individual gas supply devices 51 can conveniently be prevented from approaching each other. This can prevent with increased convenience interference in the rate of gas supply between the plurality of individual gas supply devices 51. As a result, even where the plurality of solution treating units SU are arranged to adjoin each other substantially in the horizontal direction, the treatment quality of the solution treating units SU can be improved conveniently.

The substrate treating apparatus 1 with the individual gas exhaust devices 61 can change the rate of gas exhaust from each solution treating unit SU. For example, the rates of gas exhaust from the solution treating units SUa and SUb can be made different, or the rates of gas exhaust from the solution treating units SUa and SUb can be made equal. Consequently, an appropriate quantity of gas can be discharged in appropriate timing from each solution treating unit SU. Therefore, the treatment quality in each solution treating unit SU can be improved conveniently.

Particularly, even where a plurality of solution treating units SU are arranged in the same chamber CH to perform the same type of solution treatment, the individual gas exhaust devices 61 adjust the rate of gas exhaust for each solution treating unit SU. Consequently, the treatment quality of each solution treating unit SU can be improved further conveniently.

The plurality of individual gas exhaust devices 61 are separated from one another at least inside the substrate treating apparatus 1. In other words, the gas flow paths of the individual gas exhaust devices 61a-61p are not connected to one another at least inside the substrate treating apparatus 1. Therefore, the rate of gas exhaust can be adjusted conveniently for each individual gas exhaust device 61 by using external equipment that adjusts the rate of gas exhaust (e.g. the exhaust dampers 66a-66p). Consequently, the treatment quality in the solution treating units SU can be improved conveniently.

Since the plurality of individual gas exhaust devices 61 are separated from one another at least inside the substrate treating apparatus 1, the rates of gas exhaust can be prevented conveniently from interfering with one another among the individual gas exhaust devices 61. For example, the rate of gas exhaust from part of the individual gas exhaust devices 61 can be prevented conveniently from causing variations in the rates of gas exhaust from the other individual gas exhaust devices 61. When the rate of gas exhaust from the individual gas exhaust device 61a is changed intentionally, for example, this change can be prevented conveniently from inadvertently varying the rates of gas exhaust from the individual gas exhaust devices 61 other than the individual gas exhaust device 61a. This can conveniently improve the treatment quality in the solution treating units SU.

Since the individual gas exhaust devices 61 have the exhaust ports 63, the individual gas exhaust devices 61 can easily be connected to external equipment (e.g. the exhaust dampers 66a-66p and gas suction device 67).

The individual gas exhaust devices 61 with the exhaust pipes 62 can conveniently send the gas discharged from the solution treating units SU to the external equipment.

The individual gas exhaust devices 61 can discharge the gas in the cups 42/47 of the corresponding solution treating units SU. Consequently, the individual gas exhaust devices 61 can discharge the gas conveniently from the solution treating units SU.

Since the individual gas exhaust devices 61 have the exhaust pipes 62, the individual gas exhaust device 61 can discharge gas conveniently from the solution treating units SU. Further, since the individual gas exhaust devices 61 have the exhaust pipes 62, the individual gas exhaust devices 61 can be connected conveniently to the cups 42/47. Consequently, the individual gas exhaust devices 61 can discharge gas with increased convenience from the solution treating units SU.

The plurality of exhaust pipes 62, which are respectively connected to the plurality of cups 42/47 adjoining each other substantially in the horizontal direction, extend in different directions from the cups 42/47. Consequently, the plurality of individual gas exhaust devices 61 can conveniently be prevented from approaching each other. This can conveniently prevent interference in the rate of gas exhaust between the plurality of individual gas exhaust devices 61. As a result, even where the plurality of solution treating units SU are arranged to adjoin each other substantially in the horizontal direction, the treatment quality of the solution treating units SU can be improved conveniently.

The substrate treating apparatus 1 has the controller 75 which controls individually the rate of gas supply to each solution treating unit SU. The quality of each solution treating unit SU in performing the solution treatment of wafers W can therefore be improved conveniently.

The controller 75 adjusts individually the rate of gas supply to the solution treating units SU according to operation of the solution treating units SU. For example, the controller 75 changes the rate of gas supply to the solution treating units SU, depending on whether the solution treating units SU are engaged in the solution treatment or they are on standby. More particularly, the controller 75 changes individually the rate of gas supply to the solution treating units SU at starting time and finishing time of the solution treatment. The controller 75 changes individually the rate of gas supply to the solution treating units SU at starting time and finishing time of the standby. Consequently, the treatment quality of each solution treating unit can be improved with increased convenience.

The controller 75 changes the rate of gas supply to the solution treating units SU while the solution treating units SU are engaged in the solution treatment. In other words, the rate of gas supply to the solution treating units SU is not constant over a period in which the solution treating units SU are engaged in the solution treatment. Thus, while the solution treating units SU are engaged in the solution treatment, an appropriate quantity of gas can be supplied in appropriate timing to the solution treating units. The treatment quality of the solution treating units SU can therefore be improved with increased convenience.

The controller 75 adjusts the rate of gas supply to the solution treating units SU based on an elapsed time from a starting time of the solution treatment. This realizes an appropriate quantity of gas being supplied in appropriate timing to the solution treating units SU.

The controller 75 controls individually the rate of gas exhaust from each solution treating unit SU. The quality of each solution treating unit SU in performing the solution treatment of wafers W can therefore be improved conveniently.

The controller 75 adjusts individually the rate of gas exhaust from the solution treating units SU according to operation of the solution treating units SU. Consequently, the treatment quality of each solution treating unit can be improved with increased convenience.

The controller 75 changes the rate of gas exhaust from the solution treating units SU while the solution treating units SU are engaged in the solution treatment. Consequently, the treatment quality of each solution treating unit SU can be improved with increased convenience.

The controller 75 adjusts the rate of gas exhaust from the solution treating units SU based on an elapsed time from a starting time of the solution treatment. This realizes an appropriate quantity of gas being exhausted in appropriate timing from the solution treating units SU.

This invention is not limited to the foregoing embodiment, but may be modified as follows:

(1) In the embodiment, the substrate treating apparatus 1 has the distributing pipes 56. The invention is not limited to this. For example, the distributing pipes 56 may be omitted. In the embodiment, a plurality of individual gas supply devices 51 are indirectly connected through the distributing pipes 56 inside the substrate treating apparatus 1. The invention is not limited to this. For example, the individual gas supply devices 51 may be separated from one another at least inside the substrate treating apparatus 1.

Figure 13:
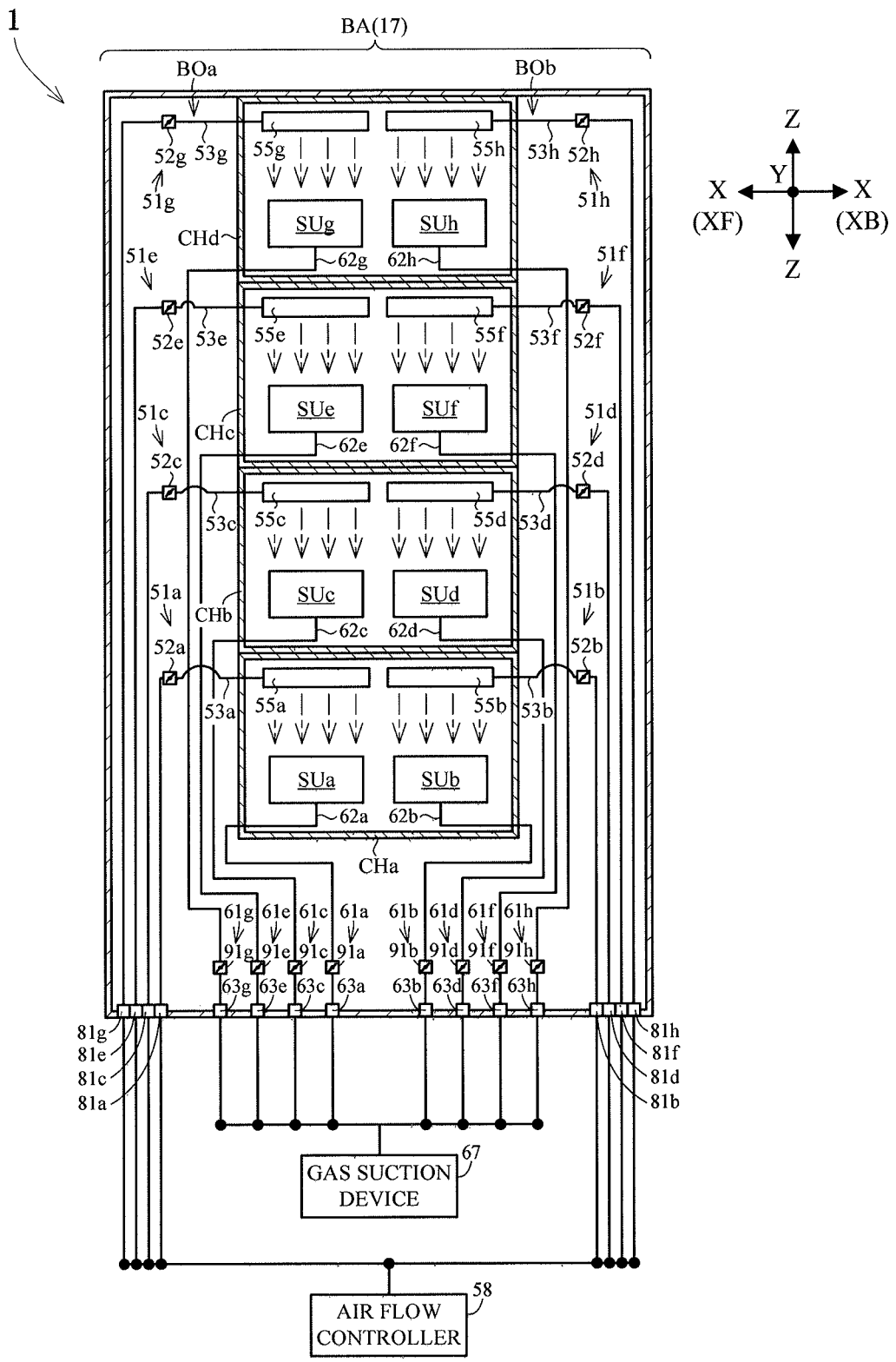
FIG. 13 is a detailed side view showing individual gas supply devices and individual gas exhaust devices according to modified embodiments.

Reference is made to FIG. 13. FIG. 13 is a detailed side view showing individual gas supply devices and individual gas exhaust devices according to a modified embodiment. For expediency, FIG. 13 shows only individual gas supply devices 51 and individual gas exhaust devices 61 relating to the solution treating units SUa-SUh. Components identical to those of the embodiment are shown with the same signs, and will not particularly be described.

As shown, the individual gas supply device Ma has a damper 52$a$, a supply pipe 53$a$ and a supply port 81$a$. Similarly, the individual gas supply devices 51$b$-51$h$ respectively have dampers 52$b$-52$h$, supply pipes 53$b$-53$h$ and supply ports 81$b$-81$h$.

The supply pipes 53$a$-53$h$ each have one end thereof directly connected to the blowout units 55$a$-55$h$. The supply dampers 52$a$-52$h$ are mounted in intermediate positions of the supply pipes 53$a$-53$h$. The supply dampers 52$a$-52$h$ are arranged outside the chambers CH. The other end of each supply pipe 53$a$-53$h$ is connected to one of the supply ports 81$a$-81$h$. The supply ports 81$a$-81$h$ are connectable to external equipment installed outside the substrate treating apparatus 1. The supply ports 81$a$-81$h$ are arranged, for example, in the bottom surface of the substrate treating apparatus 1. The supply ports 81$a$-81$h$ are connected to the air flow controller 58 which is external equipment.

According to this modified embodiment, the individual gas supply devices 51$a$-51$h$ are separated from one another at least inside the substrate treating apparatus 1. In other words, the plurality of individual gas supply devices 51 are not connected directly or indirectly to one another at least inside the substrate treating apparatus 1. The gas flow paths of the gas supply devices 51$a$-51$h$ are therefore maintained in a mutually separated state at least inside the substrate treating apparatus 1. It is therefore possible to effectively prevent interference of the rates of gas supply among the plurality of gas supply devices 51$a$-51$h$. Consequently, the treatment quality in each solution treating unit SU can be improved conveniently.

Since, in this modified embodiment, the individual gas supply devices 51$a$-51$h$ have the supply ports 81$a$-81$h$, the individual gas supply devices 51$a$-51$h$ can easily be connected to the external equipment.

(2) In the embodiment, the individual gas supply devices 51 have the supply dampers 52. The invention is not limited to this. For example, the individual gas supply devices 51 do not need to have the supply dampers 52.

Figure 14:
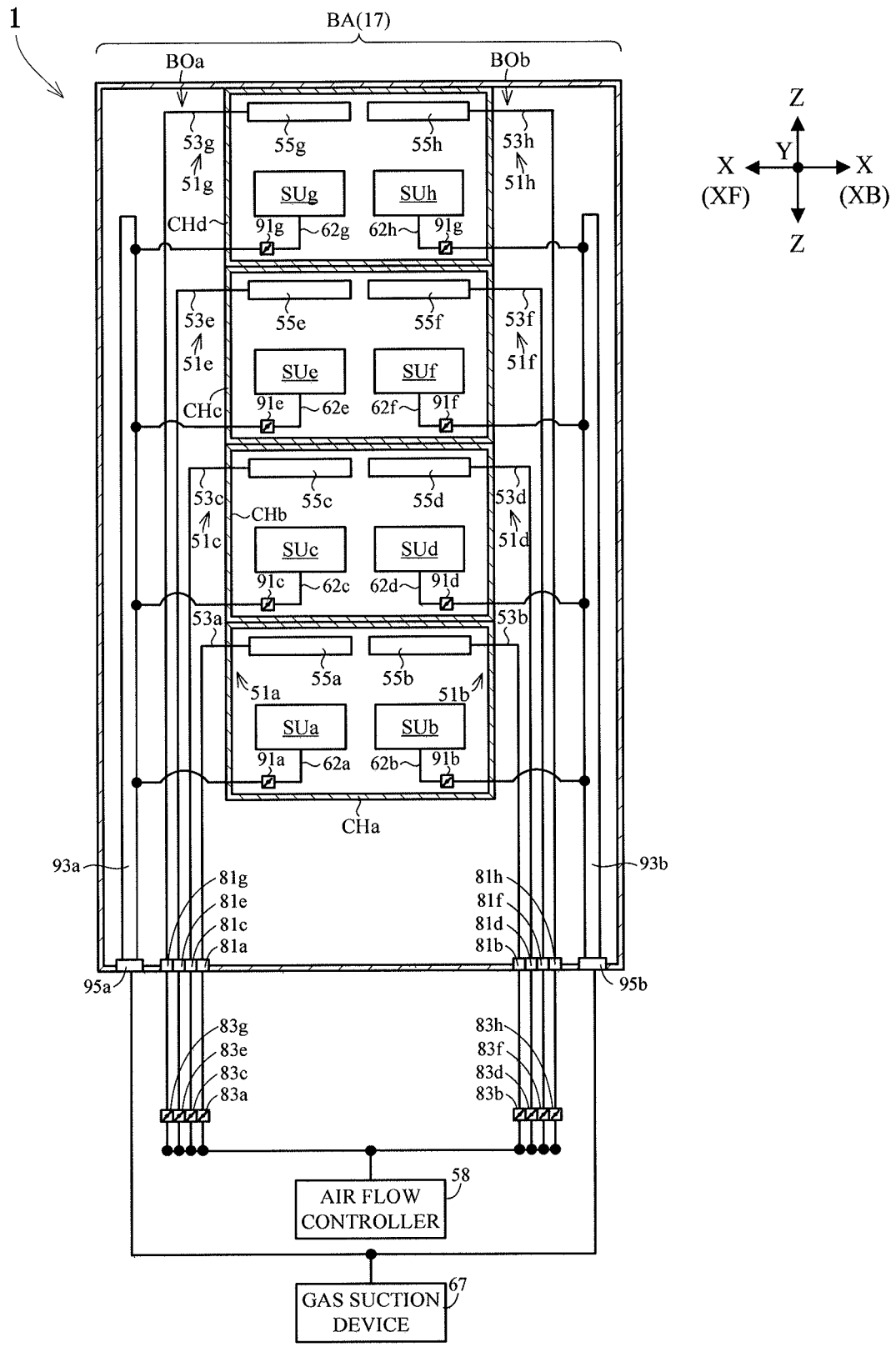
FIG. 14 is a detailed side view showing individual gas supply devices and individual gas exhaust devices according to modified embodiments.

Reference is made to FIG. 14. FIG. 14 is a detailed side view showing the individual gas supply devices and individual gas exhaust devices according to a modified embodiment. For expediency, FIG. 14 shows only individual gas supply devices 51 and individual gas exhaust devices 61 relating to the solution treating units SUa-SUh. Components identical to those of the embodiment are shown with the same signs, and will not particularly be described.

As shown, the individual gas supply device Ma has a supply pipe 53a and a supply port 81a. Similarly, the individual gas supply devices 51b-51h respectively have supply pipes 53b-53h and supply ports 81b-81h. The individual gas supply devices 51a-51h do not have the supply dampers 52 described in the embodiment.

The supply pipes 53a-53h each have one end thereof directly connected to the blowout unit 55a-55h. The other end of each supply pipe 53a-53h is connected to one of the supply ports 81a-81h. The supply ports 81a-81h are connectable to external equipment installed outside the substrate treating apparatus 1. The supply ports 81a-81h are arranged, for example, in the bottom surface of the substrate treating apparatus 1. The supply ports 81a-81h are connected to supply dampers 83a-83h, respectively. The supply dampers 83a-83h adjust the rates of gas supply. The supply dampers 83a-83h are connected to the air flow controller 58. The supply dampers 83a-83h and air flow controller 58 are external equipment of the substrate treating apparatus 1. The supply dampers 83a-83h and air flow controller 58 are installed outside the substrate treating apparatus 1. The controller 75 may control the supply dampers 83a-83h. The supply dampers 83a-83h are an example of the external equipment (more strictly, gas supplying external equipment) in this invention.

According to this modified embodiment, the individual gas supply devices 51a-51h are separated from one another at least inside the substrate treating apparatus 1. It is therefore possible to effectively prevent interference of the rates of gas supply among the plurality of gas supply devices 51a-51h. Even though the individual gas supply devices 51a-51h are without the supply dampers 52, the rate of gas supply can be adjusted for each individual gas supply device 51 by using the external equipment which adjusts the rates of gas supply (e.g. the supply dampers 83a-83h). Consequently, the treatment quality in each solution treating unit SU can be improved conveniently.

(3) In the embodiment, the individual gas exhaust devices 61 have no exhaust dampers. The invention is not limited to this. That is, the individual gas exhaust devices 61 may have exhaust dampers.

One modified embodiment will be described with reference to FIG. 13. The individual gas exhaust device 61a has an exhaust pipe 62a, an exhaust port 63a and an exhaust damper 91a. Similarly, the individual gas exhaust devices 61b-61h, respectively, have exhaust pipes 62b-62h, exhaust ports 63b-63h and exhaust dampers 91b-91h.

The exhaust pipes 62a-62h each have one end thereof connected to the cup 42 of the solution treating unit SUa-SUh. The exhaust dampers 91a-91h are mounted in intermediate positions of the exhaust pipes 62a-62h. The exhaust dampers 91a-91h adjust the rates of gas exhaust from the solution treating units SUa-SUh, respectively. The exhaust dampers 91a-91h are arranged outside the chambers CH, respectively. The exhaust pipes 62a-62h have the other ends connected to the exhaust ports 63a-63h, respectively. The exhaust ports 63a-63h are connectable to external equipment installed outside the substrate treating apparatus 1. The exhaust ports 63a-63h are arranged, for example, in the bottom surface of the substrate treating apparatus 1.

The controller 75 controls the exhaust dampers 91a-91h.

The exhaust ports 63a-63h are connected to the gas suction device 67, respectively. The gas suction device 67 is external equipment of the substrate treating apparatus 1. Note that the exhaust dampers 66a-66h described in the embodiment are omitted.

According to the modified embodiment of FIG. 13, the individual gas exhaust devices 61a-61h, with the exhaust dampers 91a-91h, can conveniently adjust the rates of gas exhaust from the solution treating units SU.

Another modified embodiment will be described with reference to FIG. 14. As shown, the individual gas exhaust device 61a has an exhaust pipe 62a and an exhaust damper 91a. Similarly, the individual gas exhaust devices 61b-61h, respectively, have exhaust pipes 62b-62h and exhaust dampers 91b-91h.

The exhaust pipes 62a-62h each have one end thereof connected to the cup 42 of the solution treating unit SUa-SUh. The exhaust dampers 91a-91h are mounted in intermediate positions of the exhaust pipes 62a-62h. The exhaust dampers 91a-91h are arranged inside the chambers CH, respectively.

The substrate treating apparatus 1 has collecting pipes 93a and 93b. The collecting pipes 93a and 93b are provided as individually corresponding to the solution treating unit groups. Specifically, the collecting pipe 93a is related to one solution treating unit group consisting of the solution treating units SUa, SUc, SUe and SUg. The collecting pipe 93b is related to one solution treating unit group consisting of the solution treating units SUb, SUd, SUf and SUh.

As a result, the collecting pipe 93a is related to the solution treating units SUa, SUc, SUe and SUg. The collecting pipe 93a is related to the cups 42 of the solution treating unit SUa, SUc, SUe and SUg. Further, the collecting pipe 93a is related to the individual gas exhaust devices 61a, 61c, 61e and 61g which discharge gas from the solution treating units SUa, SUc, SUe and SUg. The same is the case with the other collecting pipe 93b.

The collecting pipes 93a and 93b collect gas only from the plurality of individual gas exhaust devices 61 corresponding to the solution treating unit groups, respectively. For example, the collecting pipe 93a collects gas only from the individual gas exhaust devices 61a, 61c, 61e and 61g. However, the collecting pipe 93a does not collect the gas from the individual gas exhaust devices 61 other than the individual gas exhaust devices 61a, 61c, 61e and 61g. Similarly, the collecting pipe 93b collects gas only from the individual gas exhaust devices 61b, 61d, 61f and 61h.

Specifically, the collecting pipe 93a is connected to the exhaust pipes 62a, 62c, 62e and 62g. However, the collecting pipe 93a is not connected to the exhaust pipes 62 other than the exhaust pipes 62a, 62c, 62e and 62g. Similarly, the collecting pipe 93b is connected to the individual gas exhaust devices 61b, 61d, 61f and 61h.

The collecting pipes 93a and 93b, when not particularly distinguished, will be written simply "collecting pipe(s) 93".

The collecting pipes 93 are installed to extend in the up-down direction Z in positions laterally of the solution treating unit groups corresponding to the collecting pipes 93. For example, the collecting pipe 93a is installed to extend in the up-down direction Z in a position laterally (e.g. forward XF) of the solution treating units SUa, SUc, SUe and SUg. The collecting pipe 93b is installed to extend in the up-down direction Z in a position laterally (e.g. backward XB) of the solution treating units SUb, SUd, SUf and SUh.

The collecting pipes 93 have a range in the up-down direction Z that preferably includes height positions of all the solution treating units SU belonging to the corresponding solution treating unit groups. It is preferred, for example, that the range in the up-down direction Z of the collecting pipe 93a covers height positions of the solution treating units SUa, SUc, SUe and SUg.

The collecting pipes 93 are installed to extend in the up-down direction Z, laterally of the cup groups corresponding to the collecting pipes 93. For example, the collecting pipe 93a is installed to extend in the up-down direction Z, in a position laterally (e.g. forward XF) of the cups 42 of the solution treating units SUa, SUc, SUe and SUg. The collecting pipe 93b is installed to extend in the up-down direction Z, in a position laterally (e.g. backward XB) of the cups 42 of the solution treating units SUb, SUd, SUf and SUh.

The collecting pipe 93 has a range in the up-down direction Z that preferably includes height positions of all the cups 42 belonging to the corresponding cup group. It is preferred, for example, that the range in the up-down direction Z of the collecting pipe 93a covers height positions of the cups 42 of the solution treating units SUa, SUc, SUe and SUg.

The substrate treating apparatus 1 further includes exhaust ports 95a and 95b for the collecting pipes. The exhaust ports 95a and 95b are provided individually for the collecting pipes 93a and 93b. The exhaust port 95a is connected to the collecting pipe 93a. The exhaust port 95b is connected to the collecting pipe 93b. The exhaust ports 95a and 95b are connectable to external equipment installed outside the substrate treating apparatus 1. The exhaust ports 95a and 95b are arranged in a bottom surface of the treating section 17, for example. The exhaust ports 95a and 95b are connected to the gas suction device 67 which is external equipment.

According to the modified embodiment of FIG. 14 also, the individual gas exhaust devices 61a-61h, with the exhaust dampers 91a-91h, can conveniently adjust the rates of gas exhaust from the solution treating units SU.

Further, the substrate treating apparatus 1 with the collecting pipe 93a can easily uniform the shape, size, direction and so on of the individual gas exhaust devices 61, among the individual gas exhaust devices 61a, 61c, 61e and 61g. Specifically, the shape, size, direction and so on of the exhaust pipes 62 may easily be unified among the gas exhaust pipes 62a, 62c, 62e and 62g. Further, the arrangement of the exhaust pipes 62 and supply dampers 91 can easily be unified among the individual gas exhaust devices 61a, 61c, 61e and 61g.

As a result, the rates of gas exhaust can be prevented conveniently from interfering with one another among the individual gas exhaust devices 61a, 61c, 61e and 61g. For example, the rate of gas exhaust from the individual gas exhaust device 61a may be prevented conveniently from causing variations in the rates of gas exhaust from the other individual gas exhaust devices 61c, 61e and 61g. When the rate of gas exhaust from the individual gas exhaust device 61a is changed intentionally, for example, this change can be prevented conveniently from inadvertently varying the rates of gas exhaust from the other individual gas exhaust devices 61c, 61e and 61g. This can conveniently improve the treatment quality in the solution treating units SUa, SUc, SUe and SUg relating to the collecting pipe 93a.

Similarly, the substrate treating apparatus 1 with the collecting pipe 93b can easily uniform the shape, size, direction and so on of the individual gas exhaust devices 61. As a result, the rates of gas exhaust can be prevented conveniently from interfering with one another among the individual gas exhaust devices 61. This can conveniently improve the treatment quality in the solution treating units SU.

The collecting pipe 93a is installed to extend in the up-down direction Z, in a position laterally of the solution treating unit group consisting of the solution treating units SUa, SUc, SUe and SUg. Therefore, the solution treating units SUa, SUc, SUe and SUg are located substantially in the same direction relative to the collecting pipe 93a. Further, the solution treating units SUa, SUc, SUe and SUg are spaced substantially the same distance from the collecting pipe 93a. Therefore, the shape, size, direction and so on of the individual gas exhaust devices 61 can be uniformed with increased ease among the individual gas exhaust devices 61a, 61c, 61e and 61g corresponding to the solution treating units SUa, SUc, SUe and SUg.

Similarly, the collecting pipe 93b is installed to extend in the up-down direction Z, in a position laterally of the corresponding solution treating unit group. Therefore, the shape, size, direction and so on of the individual gas exhaust devices 61 can be uniformed with increased ease.

The range in the up-down direction Z of the collecting pipes 93 covers the height positions of all the solution treating units SU belonging to the corresponding solution treating unit groups. Therefore, the shape, size, direction and so on of the individual gas exhaust devices 61 can be uniformed with increased ease.

The collecting pipe 93a is installed to extend in the up-down direction Z, laterally of the cup group consisting of the cups 42 of the solution treating units SUa, SUc, SUe and SUg. Therefore, the cups 42 of the solution treating units SUa, SUc, SUe and SUg are located substantially in the same direction relative to the collecting pipe 93a. Further, the cups 42 of the solution treating units SUa, SUc, SUe and SUg are spaced substantially the same distance from the collecting pipe 93a. Therefore, the shape, size, direction and so on of the individual gas exhaust devices 61 can be uniformed with increased ease among the individual gas exhaust devices 61a, 61c, 61e and 61g corresponding to the cups 42 of the solution treating units SUa, SUc, SUe and SUg.

Similarly, the collecting pipe 93b is installed to extend in the up-down direction Z, in a position laterally of the corresponding cup group. Therefore, the shape, size, direction and so on of the individual gas exhaust devices 61 can be uniformed with increased ease.

The range in the up-down direction Z of the collecting pipes 93 covers the height positions of all the cups 42 belonging to the corresponding cup groups. Therefore, the shape, size, direction and so on of the individual gas exhaust devices 61 can be uniformed with increased ease.

The same collecting pipe 93 does not collect gas from the plurality of individual gas exhaust devices 61 corresponding to the solution treating units SU arranged to adjoin each other substantially in the horizontal direction. For example, the solution treating units SUa and SUb are arranged to adjoin each other substantially in the horizontal direction. The solution treating unit SUa corresponds to the individual gas exhaust device 61a. The solution treating unit SUb corresponds to the individual gas exhaust device 61b. The collecting pipe 93a collects gas from the individual gas exhaust device 61a. The collecting pipe 93b collects gas from the individual gas exhaust device 61b. Thus, the same collecting pipe 93 does not collect gas from both of the individual gas exhaust devices 61a and 61b. The rates of gas exhaust from the treating units SUa and SUb can therefore be prevented conveniently from interfering with each other. This can conveniently improve the treatment quality in the solution treating units SUa and SUb. Thus, even where a plurality of solution treating units SU are arranged to adjoin each other substantially in the horizontal direction, the treatment quality in the solution treating units SU can be improved conveniently.

Since the collecting pipe 93 collects gas from the plurality of (e.g. four) individual gas exhaust devices 61, the individual gas exhaust devices 61 can be reduced in size. Consequently, the installation space for the individual gas exhaust devices 61 can be reduced.

(4) In the embodiment, the air flow controller 58 and gas suction device 67 are external equipment. The invention is not limited to this. For example, the air flow controller 58 and gas suction device 67 may be installed inside the substrate treating apparatus 1.

Figure 15:
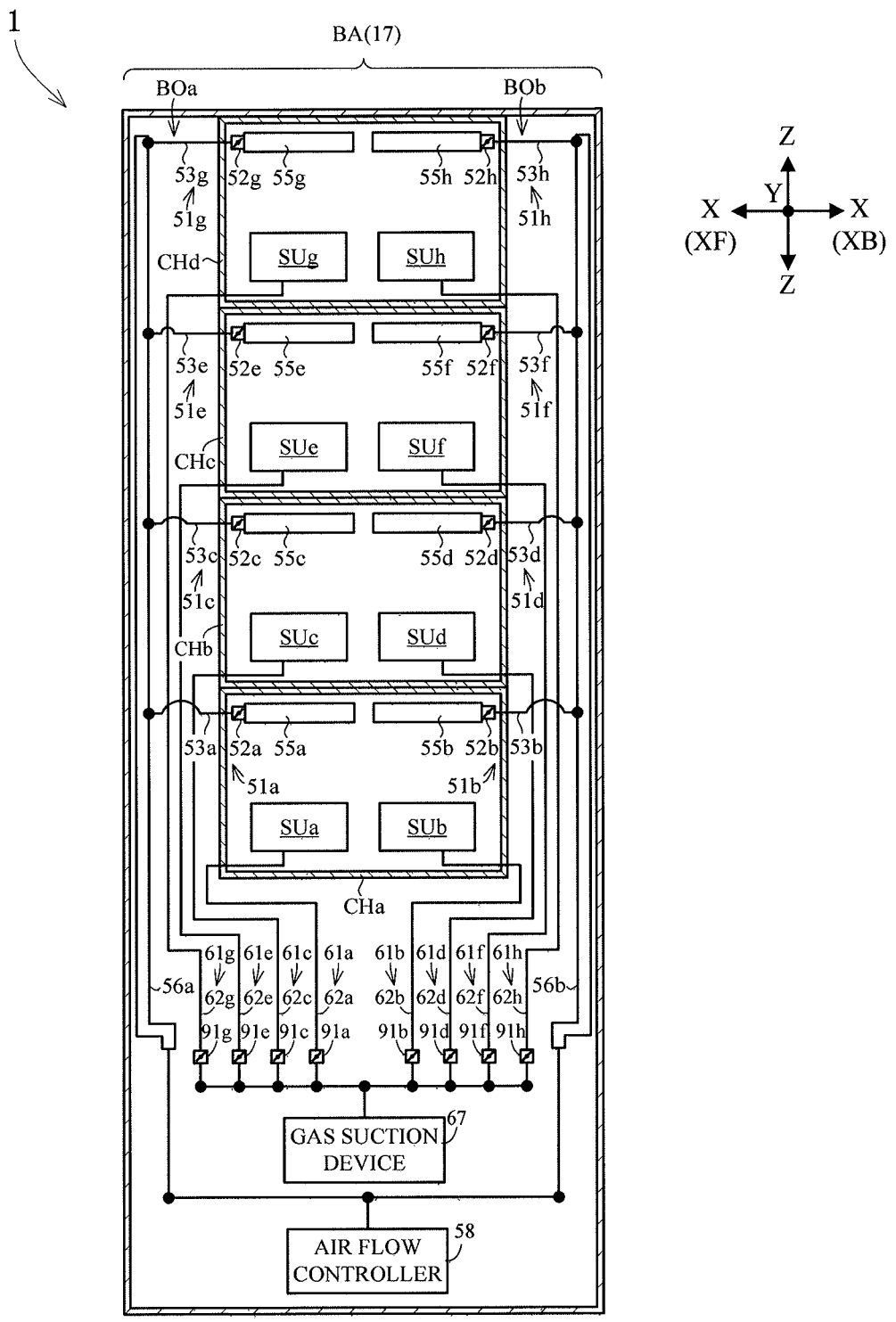
FIG. 15 is a detailed side view showing individual gas supply devices and individual gas exhaust devices according to a modified embodiment.

Reference is made to FIG. 15. FIG. 15 is a detailed side view showing individual gas supply devices and individual gas exhaust devices according to a modified embodiment. For expediency, FIG. 15 shows only individual gas supply devices 51 and individual gas exhaust devices 61 relating to the solution treating units SUa-SUh. Components identical to those of the embodiment are shown with the same signs, and will not particularly be described.

As shown, the air flow controller 58 and gas suction device 67 may be installed inside the substrate treating apparatus 1 (e.g. in a lower part of the treating block BA). This arrangement can omit the exhaust ports 63. That is, the construction of the individual gas exhaust devices 61 can be simplified. The supply ports 57 for the distributing pipes can also be omitted.

(5) In the embodiment, the rates of gas supply and exhaust relating to the solution treating units SUa are the same as shown in FIG. 12. The invention is not limited to this. The rates of supply and exhaust to/from the solution treating unit SUa may be different from each other. The same may be said of the rates of supply and exhaust to/from the other solution treating units SU.

(6) In the embodiment, the controller 75 changes the rate of gas supply to the solution treating unit SU upon lapse of the predetermined time Δts after the solution treating unit SU starts solution treatment. The invention is not limited to this. For example, the controller 75 may change the rate of gas supply to the solution treating unit SU based on treatment conditions for the solution treatment. Here, the treatment conditions for the solution treatment include discharge timing of a treating solution, discharge rate of the treating solution, rotation speed of the wafer W and so on.

Similarly, in the embodiment, the controller 75 changes the rate of gas exhaust from the solution treating unit SU upon lapse of the predetermined time Δts after the solution treating unit SU starts solution treatment. The invention is not limited to this. For example, the controller 75 may change the rate of gas exhaust from the solution treating unit SU based on the treatment conditions for the solution treatment.

(7) In the embodiment, the rates of gas supply and gas exhaust are changed while the solution treating units SU are engaged in solution treatment. The invention is not limited to this. That is, at least either one of the rates of gas supply and gas exhaust may be maintained constant while the solution treating units SU are engaged in solution treatment.

(8) In the embodiment, the controller 75 controls both the rate of gas supply to the solution treating units SU and the rate of gas exhaust from the solution treating units SU. The invention is not limited to this. For example, the controller 75 may control only one of the rate of gas supply to the solution treating units SU and the rate of gas exhaust from the solution treating units SU.

(9) In the embodiment, the individual gas supply devices 51 may vary the rate of gas supply to the solution treating units SU, for example, by adjusting gas flow rate [m$^3$/s]. Or the individual gas supply devices 51 may vary the rate of gas supply to the solution treating units SU by adjusting gas flow velocity [m/s]. In other words, the supply dampers 52 may adjust gas flow rate [m$^3$/s], or may adjust gas flow velocity [m/s].

Similarly, the individual exhaust devices 61 may vary the rate of gas exhaust from the solution treating units SU, for example, by adjusting gas flow rate [m$^3$/s]. Or the individual gas exhaust devices 61 may vary the rate of gas exhaust from the solution treating units SU by adjusting gas flow velocity [m/s]. In other words, the exhaust dampers 91 may adjust gas flow rate [m$^3$/s], or may adjust gas flow velocity [m/s].

(10) In the embodiment, the plurality of solution treating units SU installed in the same chamber CH carry out the same type of solution treatment of the wafers W. The invention is not limited to this. That is, the plurality of solution treating units SU installed in the same chamber CH may carry out different solution treatments of the wafers W. For example, an antireflection film coating unit BARC and a resist film coating unit RESIST may be installed in the same chamber CH.

(11) The embodiment has exemplified antireflection film forming treatment, resist film forming treatment and developing treatment as solution treatment. The invention is not limited to this. The solution treatment may be protective film forming treatment, for example. The protective film forming treatment is a treatment for forming protective film on the surfaces of the wafers W by applying a protective film material to the wafers W. Or the solution treatment may be cleaning treatment. The cleaning treatment is a treatment for cleaning the wafers W by supply a cleaning liquid or rinsing liquid to the wafers W.

(12) In the embodiment, each chamber CH houses two solution treating units SU. The invention is not limited to this. One chamber CH may house only one solution treating unit SU. Or one chamber CH may house three or more solution treating units SU.

(13) In the embodiment, the distributing pipes 56 are installed based on the solution treating unit groups. The invention is not limited to this. For example, the distributing pipes 56 may be installed based on the blowout unit groups. More particularly, the distributing pipes 56a, 56b, 56c and 56d may be provided individually to correspond to the blowout unit groups.

(14) In the embodiment, the collecting pipes 93 are installed based on the solution treating unit groups. The invention is not limited to this. For example, the collecting pipes 93 may be installed based on the cup groups. More particularly, the collecting pipes 93a and 93b may be provided individually to correspond to the cup groups.

(15) In the embodiment, the substrate treating apparatus 1 has one individual gas supply device 51 for one solution treating unit SU. The invention is not limited to this. That is, the substrate treating apparatus 1 may have a plurality of individual gas supply devices 51 for one solution treating unit SU.

(16) In the embodiment, the substrate treating apparatus 1 has one blowout unit 55 for one solution treating unit SU. The invention is not limited to this. That is, the substrate treating apparatus 1 may have a plurality of blowout units 55 for one solution treating unit SU.

(17) In the embodiment, the substrate treating apparatus 1 had one individual exhaust device 61 for one solution treating unit SU. The invention is not limited to this. That is, the substrate treating apparatus 1 may have a plurality of individual exhaust devices 61 for one solution treating unit SU.

(18) In the embodiment, each of the solution treating units SUa-SUh has one cup 42. The invention is not limited to this. Each solution treating unit SUa-SUh may have a plurality of cups 42. Similarly, in the embodiment, each of the solution treating units SUi-SUp has one cup 47. The invention is not limited to this. Each solution treating unit SUi-SUp may have a plurality of cups 47.

(19) Further variations may be made by appropriately combining the constructions of the foregoing embodiment and each modified embodiment described above.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus comprising:
    a first solution treating unit for performing solution treatment of substrates;
    a second solution treating unit for performing solution treatment of the substrates;
    a first chamber for housing the first solution treating unit and the second solution treating unit;
    a first individual gas supply device provided to correspond to the first solution treating unit, for supplying gas at a variable rate to the first solution treating unit;
    a second individual gas supply device provided to correspond to the second solution treating unit, for supplying gas at a variable rate to the second solution treating unit;
    a gas exhaust device for exhausting gas from the first solution treating unit and the second treating unit;
    a transport mechanism disposed outside the first chamber for transporting the substrates to the first solution treating unit and the second solution treating unit; and
    a transporting space in which the transport mechanism is installed;
    wherein
    the first individual gas supply device includes a first supply pipe extending in a first direction from an interior of the first chamber to an exterior of the first chamber;
    the second individual gas supply device includes a second supply pipe extending in a second direction from the interior of the first chamber to the exterior of the first chamber;
    the first direction is different from the second direction;
    the first solution treating unit and the second solution treating unit are arranged in the same space;
    the first solution treating unit and the second solution treating unit carry out the solution treatment in the same space;
    the first chamber and the transporting space extend in a third direction;
    the first direction is perpendicular to the third direction; and
    the second direction is perpendicular to the third direction.

2. The substrate treating apparatus according to claim 1, wherein the first direction is opposite to the second direction.

3. The substrate treating apparatus according to claim 1, wherein:
    the first individual gas supply device includes a first supply adjuster for adjusting the rate of gas supply to the first solution treating unit; and
    the second individual gas supply device includes a second supply adjuster for adjusting the rate of gas supply to the second solution treating unit.

4. The substrate treating apparatus according to claim 1, wherein the first individual gas supply device and the second individual gas supply device are separated from one another at least inside the substrate treating apparatus.

5. The substrate treating apparatus according to claim 4, wherein:
    the first individual gas supply device includes a first supply port disposed in a bottom surface of the substrate treating apparatus and coupled to the first supply pipe for connection to external equipment installed outside the substrate treating apparatus; and
    the second individual gas supply device includes a second supply port disposed in the bottom surface of the substrate treating apparatus and coupled to the second supply pipe for connection to the external equipment installed outside the substrate treating apparatus.

6. The substrate treating apparatus according to claim 1, wherein:
    the first solution treating unit and the second solution treating unit are arranged in a horizontal direction perpendicular to the third direction; and
    the first solution treating unit and the second solution treating unit are arranged on the same side with respect to the transporting space.

7. The substrate treating apparatus according to claim 1, further comprising:
    a first fluid box disposed forward of the first chamber; and
    a second fluid box disposed rearward of the first chamber;
    wherein
    the first solution treating unit is disposed forward of the second solution treating unit;
    the first supply pipe extends from the interior of the first chamber to an interior of the first fluid box; and
    the second supply pipe extends from the interior of the first chamber to an interior of the second fluid box.

8. The substrate treating apparatus according to claim 7, wherein:
    the transporting space is disposed rightward or leftward of the first chamber.

9. The substrate treating apparatus according to claim 1, wherein:
    the gas exhaust device includes
        a first individual gas exhaust device provided to correspond to the first solution treating unit for exhausting gas at a variable rate from the first solution treating unit; and
        a second individual gas exhaust device provided to correspond to the second solution treating unit for exhausting gas at a variable rate from the second solution treating unit.

10. The substrate treating apparatus according to claim 1, wherein the first solution treating unit and the second solution treating unit are arranged to perform the same type of solution treatment of the substrates.

11. A substrate treating apparatus comprising:
    a first solution treating unit for performing solution treatment of substrates;
    a second solution treating unit for performing solution treatment of the substrates;
    a gas supply device for supplying gas to the first solution treating unit and the second treating unit;

a first individual gas exhaust device provided to correspond to the first solution treating unit for exhausting gas at a variable rate from the first solution treating unit;

a second individual gas exhaust device provided to correspond to the second solution treating unit for exhausting gas at a variable rate from the second solution treating unit;

a first chamber for housing the first solution treating unit and the second solution treating unit;

a transport mechanism disposed outside the first chamber for transporting the substrates to the first solution treating unit and the second solution treating unit; and a transporting space in which the transport mechanism is installed;

wherein the first individual gas exhaust device includes a first exhaust pipe extending in a first direction from an interior of the first chamber to an exterior of the first chamber;

the second individual gas exhaust device includes a second exhaust pipe extending in a second direction from the interior of the first chamber to the exterior of the first chamber;

the first direction is different from the second direction;

the first solution treating unit and the second solution treating unit are arranged in the same space;

the first solution treating unit and the second solution treating unit carry out the solution treatment in the same space;

the first chamber and the transporting space extend in a third direction;

the first direction is perpendicular to the third direction; and the second direction is perpendicular to the third direction.

12. The substrate treating apparatus according to claim 11, wherein the first direction is opposite to the second direction.

13. The substrate treating apparatus according to claim 11, wherein:

the first individual gas exhaust device includes a first exhaust adjuster for adjusting the rate of gas exhaust from the first solution treating unit; and the second individual gas exhaust device includes a second exhaust adjuster for adjusting the rate of gas exhaust from the second solution treating unit.

14. The substrate treating apparatus according to claim 11, wherein the first individual gas exhaust device and the second individual gas exhaust device are separated from one another at least inside the substrate treating apparatus.

15. The substrate treating apparatus according to claim 14, wherein:

the first individual gas exhaust device includes a first exhaust port disposed in a bottom surface of the substrate treating apparatus and coupled to the first exhaust pipe for connection to external equipment installed outside the substrate treating apparatus; and the second individual gas exhaust device includes a second exhaust port disposed in the bottom surface of the substrate treating apparatus and coupled to the second exhaust pipe for connection to the external equipment installed outside the substrate treating apparatus.

16. The substrate treating apparatus according to claim 11, wherein:

the first solution treating unit and the second solution treating unit are arranged in a horizontal direction perpendicular to the third direction; and the first solution treating unit and the second solution treating unit are arranged on the same side with respect to the transporting space.

17. The substrate treating apparatus according to claim 11, further comprising:

a first fluid box disposed forward of the first chamber; and a second fluid box disposed rearward of the first chamber;

wherein the first solution treating unit is disposed forward of the second solution treating unit;

the first exhaust pipe extends from the interior of the first chamber to an interior of the first fluid box; and the second exhaust pipe extends from the interior of the first chamber to an interior of the second fluid box.

18. The substrate treating apparatus according to claim 17, wherein:

the transporting space is disposed rightward or leftward of the first chamber.

* * * * *